US012774354B2

(12) United States Patent
Kim et al.

(10) Patent No.: US 12,774,354 B2
(45) Date of Patent: Oct. 27, 2026

(54) POLYMER, RESIST COMPOSITION INCLUDING THE SAME, AND METHOD OF FORMING PATTERN USING THE RESIST COMPOSITION

(71) Applicant: Samsung Electronics Co., Ltd., Suwon-si (KR)

(72) Inventors: Minsang Kim, Suwon-si (KR); Haengdeog Koh, Suwon-si (KR); Yoonhyun Kwak, Suwon-si (KR); Beomseok Kim, Suwon-si (KR); Chanjae Ahn, Suwon-si (KR); Jungha Chae, Suwon-si (KR); Sungwon Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 871 days.

(21) Appl. No.: 18/164,841

(22) Filed: Feb. 6, 2023

(65) Prior Publication Data

US 2024/0124635 A1 Apr. 18, 2024

(30) Foreign Application Priority Data

Sep. 23, 2022 (KR) ........................ 10-2022-0121117

(51) Int. Cl.
*C08F 212/14* (2006.01)
*C08F 228/06* (2006.01)
(Continued)

(52) U.S. Cl.
CPC .......... *C08F 212/14* (2013.01); *C08F 228/06* (2013.01); *G03F 7/004* (2013.01); *G03F 7/038* (2013.01); *G03F 7/2004* (2013.01)

(58) Field of Classification Search
CPC ..................................................... C08F 228/06
See application file for complete search history.

(56) References Cited

U.S. PATENT DOCUMENTS 3,078,259 A 2/1963 Hatch et al.
7,736,822 B2 6/2010 Hashimoto et al.
(Continued)

FOREIGN PATENT DOCUMENTS

JP 62192412 A * 8/1987
JP 01009207 A * 1/1989
(Continued)

OTHER PUBLICATIONS

Machine translation of JP 62-192412 (no date) (Year: 0000).*
Machine translation of WO 2006/070824 (no date) (Year: 0000).*
Machine translation of JP 64-009207 (no date) (Year: 0000).*

*Primary Examiner* — Amanda C. Walke
(74) *Attorney, Agent, or Firm* — Harness, Dickey & Pierce, P.L.C.

(57) ABSTRACT

Provided are a polymer, a resist composition including the same, and a method of forming a pattern using the resist composition, the polymer including one or more of a first repeating unit represented by Formula 1 and a second repeating unit represented by Formula 2, and free of a repeating unit of which a structure changes by an acid:

Formula 1

(Continued)

-continued

Formula 2

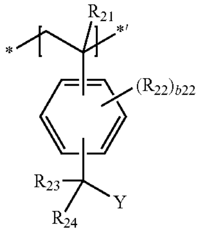

In Formulae 1 and 2, $R_{11}$ to $R_{16}$, b12, $X^-$, $R_{21}$ to $R_{24}$, b22, and Y are as described in the specification.

21 Claims, 16 Drawing Sheets

(51) Int. Cl.

| | |
|---|---|
| ***G03F 7/004*** | (2006.01) |
| ***G03F 7/038*** | (2006.01) |
| ***G03F 7/20*** | (2006.01) |

(56) References Cited

U.S. PATENT DOCUMENTS

| | | | | |
|---|---|---|---|---|
| 8,211,614 | B2 | 7/2012 | Sung et al. | |
| 9,261,785 | B2 | 2/2016 | Nishimura et al. | |
| 9,417,530 | B2 | 8/2016 | Takano et al. | |
| 10,007,182 | B2 | 6/2018 | Park et al. | |
| 2004/0222412 | A1* | 11/2004 | Bai | H01G 4/18<br>257/E21.259 |
| 2005/0260518 | A1* | 11/2005 | Mori | G03C 1/54<br>430/190 |
| 2012/0003590 | A1 | 1/2012 | Hirano et al. | |
| 2017/0242339 | A1 | 8/2017 | Hatakeyama et al. | |

FOREIGN PATENT DOCUMENTS

| | | | | |
|---|---|---|---|---|
| JP | 2002-265806 | A | 9/2002 | |
| JP | 2004-090435 | A | 3/2004 | |
| JP | 2006-008587 | A | 1/2006 | |
| JP | 4822020 | B2 | 11/2011 | |
| KR | 101342023 | B1 | 12/2013 | |
| KR | 101363738 | B1 | 2/2014 | |
| KR | 10-2017-0098186 | A | 8/2017 | |
| KR | 102076529 | B1 | 2/2020 | |
| KR | 102106346 | B1 | 5/2020 | |
| WO | WO-2006070824 | A1 * | 7/2006 | G02B 6/02033 |

* cited by examiner

POLYMER, RESIST COMPOSITION INCLUDING THE SAME, AND METHOD OF FORMING PATTERN USING THE RESIST COMPOSITION

CROSS-REFERENCE TO RELATED APPLICATION

This application is based on and claims priority under 35 U.S.C. § 119 to Korean Patent Application No. 10-2022-0121117, filed on Sep. 23, 2022, in the Korean Intellectual Property Office, the disclosure of which is incorporated by reference herein in its entirety.

BACKGROUND

1. Field

The disclosure relates to a polymer, a resist composition including the polymer, and a method of forming a pattern using the resist composition.

2. Description of the Related Art

In semiconductor manufacturing, photoresists of which the physical properties change in response to light are used to form micropatterns. Among such photoresists, a chemically amplified photoresist is widely used. Such a chemically amplified photoresist enables patterning by changing the solubility of base resin with respect to a developer, as an acid generated from a reaction between light and a photoacid generator in turn reacts with the base resin.

However, such a chemically amplified photoresist may have issues such as increased surface roughness or decreased pattern uniformity as the generated acid diffuses into unexposed regions. In addition, as the semiconductor process becomes increasingly miniaturized, control over acid diffusion becomes more difficult, which leads to a demand for a novel type of resist.

In recent years, attempts have been made to develop a material that changes its physical properties by exposure in order to overcome the limitations of such chemically amplified photoresists. However, a high dose requirement for exposure remains an issue.

In this context, there is a demand for a material of which physical properties change through a rapid reaction at a low dose of exposure.

SUMMARY

Provided are a polymer of which physical properties, in particular, solubility changes in response to exposure at a low dose, a resist composition including the polymer, and a pattern forming method using the resist composition.

Additional aspects will be set forth in part in the description which follows and, in part, will be apparent from the description, or may be learned by practice of the presented embodiments of the disclosure.

According to an aspect of the disclosure, a polymer includes at least one of a first repeating unit represented by Formula 1 or a second repeating unit represented by Formula 2, and is free of a repeating unit of which a structure changes by an acid:

[Formula 1]

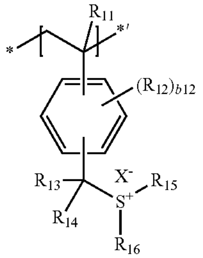

[Formula 2]

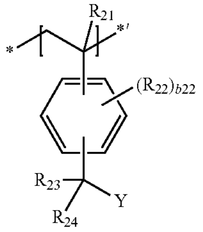

In Formulae 1 and 2, $R_{11}$ and $R_{21}$ may each independently be hydrogen, deuterium, halogen, a $C_1$-$C_6$ linear or branched alkyl group, or a halogenated $C_1$-$C_6$ linear or branched alkyl group; $R_{12}$ to $R_{10}$ and $R_{22}$ to $R_{24}$ may each independently be hydrogen, deuterium, halogen, or a linear, branched or cyclic monovalent $C_1$-$C_{20}$ hydrocarbon group optionally containing a heteroatom; b12 and b22 may each independently be integers of 1 to 4; $R_{15}$ and $R_{16}$ may each independently be a linear, branched or cyclic monovalent $C_1$-$C_{20}$ hydrocarbon group optionally containing a heteroatom, and $R_{15}$ and $R_{16}$ may optionally bond together to form a ring; $X^-$ may be a counter ion; Y may be at least one of halogen, $R_{18}SO_3$, $R_{18}CO_2$, $R_{18}PO_4$, or $NO_3$; Ria may be a linear, branched or cyclic $C_1$-$C_{20}$ monovalent hydrocarbon group optionally containing a heteroatom, and * and *' may each be a bonding site with a neighboring atom.

According to another aspect of the disclosure, a resist composition includes the above-described polymer and an organic solvent.

According to another aspect of the disclosure, a method of forming a pattern includes forming a resist film by coating the above-described resist composition, exposing at least a portion of the resist film with a high-energy beam, and developing the exposed resist film using a developer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
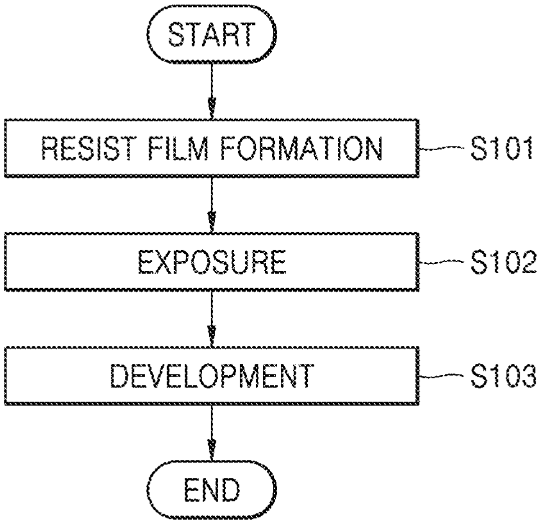
FIG. 1 is a flowchart representing a pattern forming method according to at least one embodiment.

Reference will now be made in detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

As the disclosure may have various modifications and a number of embodiments, particular embodiments are illustrated in the drawings and described in greater detail in the detailed description. However, the disclosure should not be construed as being limited to specific embodiments set forth herein. Rather, these embodiments are to be understood as encompassing all variations, equivalents, or alternatives included in the scope of the disclosure. In describing the disclosure, if it is determined that a detailed description of a relevant known art may obscure the gist of the disclosure, the detailed description thereof will be omitted.

The terms "first," "second," "third," etc., may be used herein to describe various elements, but these terms are only used to distinguish one element from another element, and should not be construed as limiting the sequence, type, and the like of the elements.

As used herein, when an element such as a layer, a film, a region, a plate, etc. is described as being on an "above" of, or "on" another element, the element may be disposed on, below, left, or, above the other element while making contact with the another element, or may be disposed on, below, left, or, above the another element without making any direct contact with the another element.

When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

As used herein, the singular forms are intended to include the plural forms as well, unless the context clearly indicates otherwise. As used herein, unless stated otherwise, the terms "comprises" and/or "comprising," or "includes" and/or "including" specify the presence of stated features, numbers, steps, operations, elements, components, ingredients, materials, or combinations thereof, but do not preclude the presence or addition of one or more other features, numbers, steps, operations, elements, components, ingredients, materials, or combinations thereof.

Whenever a range of values is presented, the range includes as expressly stated all values falling within the range and further includes the boundaries of the range. Accordingly, the range "X to Y" includes all values between X and Y, including X and Y.

As used herein, "$C_x$-$C_y$" means that the number of carbon atoms constituting a substituent ranges from x to y. For example, "$C_1$-$C_6$" means that the number of carbon atoms constituting a substituent ranges from 1 to 6, and "$C_6$-$C_{20}$" means that the number of carbon atoms constituting a substituent ranges from 6 to 20.

As used herein, examples of "monovalent hydrocarbon group" may include a linear or branched alkyl group (e.g., a methyl group, an ethyl group, a propyl group, an isopropyl group, a butyl group, an isobutyl group, a sec-butyl group, a tert-butyl group, a pentyl group, a neopentyl group, a hexyl group, a heptyl group, a 2-ethylhexyl group, a nonyl group, etc.); a monovalent saturated cycloaliphatic hydrocarbon group (e.g., a cyclopentyl group, a cyclohexyl group, a cyclopentylmethyl group, a cyclopentylethyl group, a cyclopentylbutyl group, a cyclohexylmethyl group, a cyclohexylethyl group, a cyclohexylbutyl group, a 1-adamantyl group, a 2-adamantyl group, a 1-adamantyl methyl group, a norbornyl group, a norbornylmethyl group, a tricyclodecanyl group, a tetracyclododecanyl group, a tetracyclododecanylmethyl group, a dicyclohexylmethyl group, etc.); a monovalent unsaturated cycloaliphatic hydrocarbon group (e.g., an allyl group, a 3-cyclohexenyl group, etc.); an aryl group (e.g., a phenyl group, a 1-naphthyl group, a 2-naphthyl group, etc.); an arylalkyl group (e.g., a benzyl group, a diphenylmethyl group, etc.); a heteroatom-containing monovalent hydrocarbon group (e.g., a tetrahydrofuranyl group, a methoxymethyl group, an ethoxymethyl group, a methylthiomethyl group, an acetamidomethyl group, a trifluoroethyl group, a (2-methoxyethoxy)methyl group, an acetoxymethyl group, a 2-carboxyl-1-cyclohexyl group, a 2-oxopropyl group, a 4-oxo-1-adamantyl group, a 3-oxocyclohexyl group, etc.), and/or the like. In addition, among these groups, some hydrogen atoms may be substituted with a heteroatom, for example, an oxygen atom-containing moiety, a sulfur atom-containing moiety, a nitrogen atom-containing moiety, or a halogen atom-containing moiety; or some carbon atoms may be substituted with a heteroatom, for example, an oxygen atom-containing moiety, a sulfur atom-containing moiety, a nitrogen atom-containing moiety, and/or the like. Therefore, these groups may contain a hydroxy group, a cyano group, a carbonyl group, a carboxyl group, an ether linkage, an ester linkage, a sulfonic ester linkage, a carbonate, a lactone ring, a sultone ring, a carboxylic anhydride moiety, a haloalkyl moiety, and/or the like.

As used herein, the term "alkyl group" refers to a linear or branched saturated aliphatic hydrocarbon monovalent group such as a methyl group, an ethyl group, a propyl group, an iso-butyl group, a sec-butyl group, a tert-butyl group, a pentyl group, an iso-amyl group, a hexyl group, and/or the like.

As used herein, the term "halogenated alkyl group" refers to an alkyl group of which at least one substituent group is substituted with a halogen such as $CF_3$ and/or the like.

As used herein, the term "alkoxy group" refers to a monovalent group having the formula of —$OA_{101}$ wherein $A_{101}$ is an alkyl group. For example, the alkoxy group may be (and/or include) a methoxy group, an ethoxy group, an isopropyloxy group, and/or the like.

As used herein, the term "cycloalkyl group" refers to a monovalent saturated hydrocarbon cyclic group, such as monocyclic groups (such as a cyclopropyl group, a cyclobutyl group, a cyclopentyl group, a cyclohexyl group, a cycloheptyl group, etc.); and condensed polycyclic aromatic groups (such as an adamantyl group, a norbornyl group, etc.), and/or the like.

As used herein, the term "cycloalkoxy group" refers to a monovalent group having the formula of —$OA_{102}$ wherein $A_{102}$ is a cycloalkyl group. For example, the cycloalkoxy group may be (and/or include) a cyclopropoxy group, a cyclobutoxy group, and/or the like.

As used herein, "aryl group" refers to a monovalent group having a carbocyclic aromatic system such as a phenyl group, a naphthyl group, an anthracenyl group, a phenanthrenyl group, a pyrenyl group, a chrysenyl group, and/or the like.

Hereinafter, embodiments will be described in detail with reference to the drawings, and in the description with reference to the drawings, substantially the same or corresponding components are given the same reference numerals, and the description of the identical components will not be repeated. In the drawings, the thicknesses of various layers and regions may be exaggerated for clarity. In addition, in the drawings, the thicknesses of some layers and regions may be exaggerated for convenience of description. In addition, the examples described below are provided for illustrative purposes only, and various modifications may be possible from such examples.

Polymer

A polymer according to some embodiments may include one or more selected from among a first repeating unit represented by Formula 1 and a second repeating unit represented by Formula 2. In addition, a polymer according to examples may be free of a repeating unit of which a structure changes by an acid:

[Formula 1]

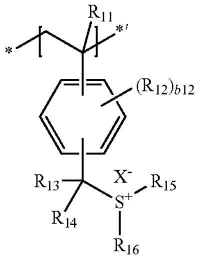

[Formula 2]

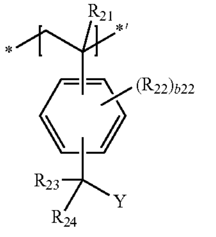

In Formulae 1 and 2, $R_{11}$ and $R_{21}$ may each independently be hydrogen, deuterium, halogen, a $C_1$-$C_6$ linear or branched alkyl group, and/or a halogenated $C_1$-$C_6$ linear or branched alkyl group; $R_{12}$ to $R_{14}$ and $R_{22}$ to $R_{24}$ may each independently be hydrogen, deuterium, halogen, or a linear, branched or cyclic monovalent $C_1$-$C_{20}$ hydrocarbon group optionally containing a heteroatom; b12 and b22 may each independently be selected from integers of 1 to 4; $R_{15}$ and $R_{16}$ may each independently be a linear, branched or cyclic $C_1$-$C_{20}$ monovalent hydrocarbon group optionally containing a heteroatom, and $R_{15}$ and $R_{16}$ may optionally bond together to form a ring; $X^-$ may be a counter ion; Y may be halogen, $R_{18}SO_3$, $R_{18}CO_2$, $R_{18}PO_4$, or $NO_3$; Ria may be a linear, branched or cyclic monovalent $C_1$-$C_{20}$ hydrocarbon group optionally containing a heteroatom, and * and *' may each be a bonding site with a neighboring atom.

Here, the repeating unit of which a structure changes by an acid refers to a repeating unit including an acid-labile group. Such an acid-labile group may refer to an ester group having a tertiary acyclic alkyl carbon, an ester group containing a tertiary alicyclic carbon, or a cyclic acetal, and/or the like. Acid-labile groups are released from the polymer by an acid and serve to allow the polymer to be more easily dissolved in a developer, for example, TMAH in aqueous solution, and/or the like.

For example, in Formulae 1 and 2, RH and $R_{21}$ may each independently be hydrogen, deuterium, F, $CH_3$, $CH_2F$, $CHF_2$, $CF_3$, $CH_2CH_3$, $CHFCH_3$, $CHFCH_2F$, $CHFCHF_2$, $CHFCF_3$, $CF_2CH_3$, $CF_2CH_2F$, $CF_2CHF_2$, and/or $CF_2CF_3$.

For example, in Formulae 1 and 2, $R_{12}$ to $R_{14}$ and $R_{22}$ to $R_{24}$ may each independently be hydrogen, deuterium, halogen, a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, and/or a $C_6$-$C_{20}$ aryl group.

For example, in Formula 1, at least one of $R_{13}$ and $R_{14}$ may be hydrogen or deuterium.

In at least one embodiment, $R_{13}$ and $R_{14}$ in Formula 1 may each independently be hydrogen or deuterium.

In another embodiment, in Formula 1, $R_{13}$ may be hydrogen or deuterium, and $R_{14}$ may be a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, and/or a $C_6$-$C_{20}$ aryl group.

For example, in Formula 2, at least one of $R_{23}$ and $R_{24}$ may be hydrogen or deuterium.

In at least one embodiment, $R_{23}$ and $R_{24}$ in Formula 2 may each independently be hydrogen or deuterium.

In another embodiment, in Formula 2, $R_{23}$ may be hydrogen or deuterium, and $R_{24}$ may be a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, and/or a $C_6$-$C_{20}$ aryl group.

For example, in Formula 1, $R_{15}$ and $R_{16}$ may each independently be a substituted or unsubstituted $C_1$-$C_{20}$ alkyl group or a substituted or unsubstituted $C_3$-$C_{20}$ carbocyclic group, and $R_{15}$ and $R_{16}$ may optionally bond together to form a ring.

In particular, in Formula 1, $R_{15}$ and $R_{16}$ may each independently be a $C_1$-$C_{10}$ alkyl group unsubstituted or substituted with at least one of halogen, a hydroxyl group, a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, and a $C_6$-$C_{10}$ aryl group; or a $C_6$-$C_{20}$ aryl group unsubstituted or substituted with at least one of halogen, a hydroxyl group, a $C_1$-$C_6$ alkyl group, a halogenated $C_1$-$C_6$ alkyl group, a $C_1$-$C_6$ alkoxy group, a $C_3$-$C_6$ cycloalkyl group, and/or a $C_3$-$C_6$ cycloalkoxy group, wherein $R_{15}$ and $R_{16}$ may optionally bond together to form a ring.

More particularly, in Formula 1,

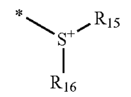

may be expressed by at least one of Formulae 3-1 to 3-3 below:

3-1

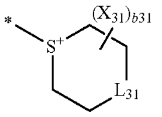

3-2

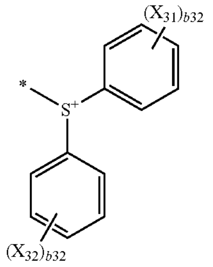

3-3

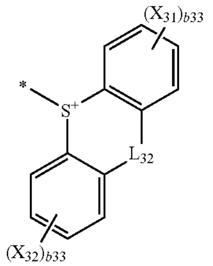

In Formulae 3-1 to 3-3, $L_{31}$ and $L_{32}$ may each independently be a single bond, O, S, CO, SO, $SO_2$, CRR', or NR, R and R' may each independently be hydrogen, deuterium, halogen, a hydroxyl group, a $C_1$-$C_6$ alkyl group, a halogenated $C_1$-$C_6$ alkyl group, a $C_1$-$C_6$ alkoxy group, a $C_3$-$C_6$ cycloalkyl group, or a $C_3$-$C_6$ cycloalkoxy group; $X_{31}$ and $X_{32}$ may each independently be hydrogen, halogen, a $C_1$-$C_6$ alkyl group, or a halogenated $C_1$-$C_6$ alkyl group; b31 may be selected from among integers of 1 to 8; b32 may be selected from among integers of 1 to 5; b33 may be selected from among integers of 1 to 4; and * may be a bonding site with a neighboring atom.

For example, in Formulae 3-1 and 3-3, $L_{31}$ and $L_{32}$ may each independently be a single bond or CRR'.

For example, in Formulae 3-1 to 3-3, $X_{31}$ and $X_{32}$ may each independently be hydrogen, F, I, or $CF_3$.

In at least one embodiment, in Formula 1, $X^-$ may be a halogen ion, $R_{17}SO_3^-$, $R_{17}CO_2^-$, $R_{17}PO_4^-$, $PF_6^-$, and/or $BF_4^-$.

In another embodiment, in Formula 1, $X^-$ may be $Cl^-$, $Br^-$, $I^-$, $R_{17}SO_3^-$, and/or $R_{17}CO_2^-$.

In another embodiment, in Formula 2, Y may be Cl, Br, I, $R_{18}SO_3$, and/or $R_{18}CO_2$.

For example, in Formulae 1 and 2, $R_{17}$ and $R_{18}$ may each independently be a $C_1$-$C_{10}$ alkyl group unsubstituted or substituted with at least one of halogen, a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, and a $C_6$-$C_{10}$ aryl group; or a $C_6$-$C_{20}$ aryl group unsubstituted or substituted with at least one of halogen, a $C_1$-$C_6$ alkyl group, a halogenated $C_1$-$C_6$ alkyl group, a $C_1$-$C_6$ alkoxy group, a $C_3$-$C_6$ cycloalkyl group, and a $C_3$-$C_6$ cycloalkoxy group.

For example, in Formulae 1 and 2, $R_{17}$ and $R_{18}$ may each independently be a $C_1$-$C_{10}$ alkyl group unsubstituted or substituted with at least one of halogen, a $C_1$-$C_6$ alkyl group, a halogenated $C_1$-$C_6$ alkyl group, and a $C_6$-$C_{10}$ aryl group; or a $C_6$-$C_{20}$ aryl group unsubstituted or substituted with at least one of halogen, a $C_1$-$C_6$ alkyl group, a halogenated $C_1$-$C_6$ alkyl group, and a $C_6$-$C_{10}$ aryl group.

In at least one embodiment, the first repeating unit may be represented by Formula 1-1 below; and the second repeating unit may be represented by Formula 2-1 below:

[Formula 1-1]

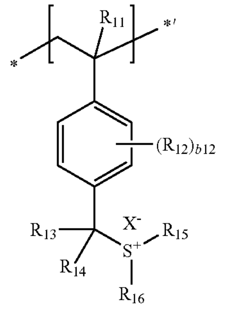

[Formula 2-1]

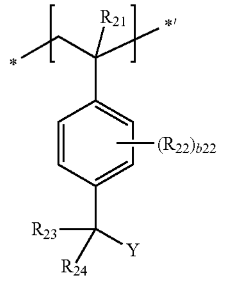

In Formulae 1-1 and 2-1, $R_{11}$ to $R_{16}$, b12, and $X^-$ are as defined in the description of Formula 1 above; $R_{21}$ to $R_{24}$, b22, and Y are as defined in the description of Formula 2 above; and * and *' are as defined in the description of Formulae 1 and 2 above.

In at least one embodiment, the first repeating unit may be selected from among the following:

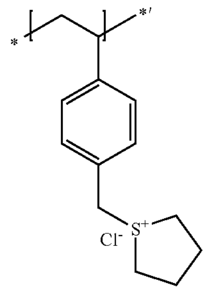

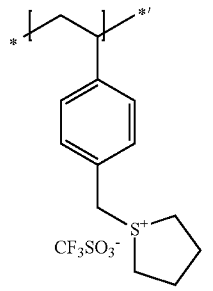

In at least one embodiment, the second repeating unit may be as follows:

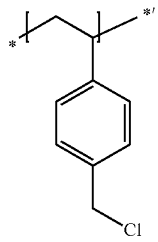

In at least one embodiment, the polymer may consist of the first repeating unit. The polymer may include the first repeating unit in an amount of about 1 mol % to about 100 mol %; about 5 mol % to about 100 mol %; and/or about 10 mol % to about 100 mol %.

In another embodiment, the polymer may consist of the second repeating unit. The polymer may include the second repeating unit in an amount of, specifically, about 1 mol % to about 100 mol %, and more specifically, about 5 mol % to about 100 mol %, in particular, about 10 mol % to about 100 mol %.

In another embodiment, the polymer may consist of the first repeating unit and the second repeating unit. For example, the polymer may include about 1 mol % to about 90 mol % of the first repeating unit and about 10 mol % to about 99 mol % of the second repeating unit; and/or about 10 mol % to about 80 mol % of the first repeating unit and about 20 mol % to about 90 mol % of the second repeating unit. For example, the polymer may include the first repeating unit and the second repeating unit in a molar ratio of about 2:1 to about 1:5.

The polymer may further include a third repeating unit represented by Formula 4:

[Formula 4]

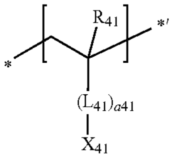

In Formula 4, $R_{41}$ may be hydrogen, deuterium, halogen, a linear or branched $C_1$-$C_6$ alkyl group, or a linear or branched halogenated $C_1$-$C_6$ alkyl group; $L_{41}$ may be a single bond, a substituted or unsubstituted $C_1$-$C_{10}$ alkylene group, a substituted or unsubstituted $C_3$-$C_{10}$ cycloalkylene group, a substituted or unsubstituted $C_3$-$C_{10}$ heterocycloalkylene group, a substituted or unsubstituted phenylene group, a substituted or unsubstituted naphthylene group, *—O—*', *—C(=O)O—*', —OC(=O)—**, *—C(=O)NH—, —NHC(=O)—, and/or any combination thereof; a41 may each independently be selected from among integers of 1 to 6; $X_{41}$ may be a non-acid labile group; and * and *' may each be a bonding site with a neighboring atom.

For example, in Formula 4, $X_{41}$ may be hydrogen or a linear, branched, or cyclic monovalent $C_1$-$C_{20}$ hydrocarbon group containing at least one polar moiety selected from among a hydroxy group, halogen, a cyano group, a carbonyl group, a carboxyl group, *—O—**, *—C(=O)O—*', —OC(=O)—**, *—S(=O)O—*', —OS(=O)—**, a lactone ring, a sultone ring, and a carboxylic anhydride moiety.

In at least one embodiment, $X_{41}$ in Formula 4 may be represented by any one of Formulae 5-1 to 5-5:

5-1

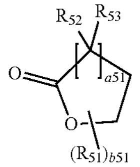

5-2

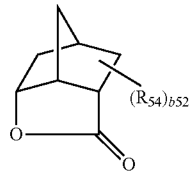

5-3

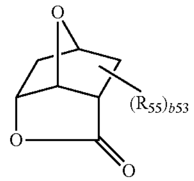

5-4

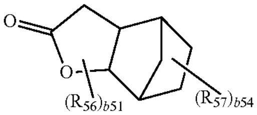

5-5

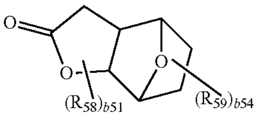

In Formulae 5-1 to 5-5, a51 may be 1 or 2; $R_{51}$ to $R_{59}$ may each independently be a bonding site with a neighboring atom, hydrogen, a hydroxy group, halogen, a cyano group, a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, or a $C_6$-$C_{10}$ aryl group, with one of $R_{51}$ to $R_{53}$, one of $R_{54}$, one of $R_{55}$, one of $R_{56}$ and $R_{57}$, and one of $R_{58}$ and $R_{59}$ being a bonding site with a neighboring atom; and b51 may be selected from among integers of 1 to 4, b52 may be selected from among integers of 1 to 10, b53 and b54 may each independently be selected from integers of 1 to 8, and b55 may be selected from among integers of 1 to 6.

In at least one embodiment, the third repeating unit represented by Formula 4 above may be represented by any one of Formulae 4-1 and 4-2 below:

4-1

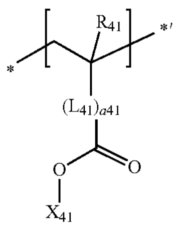

-continued 4-2

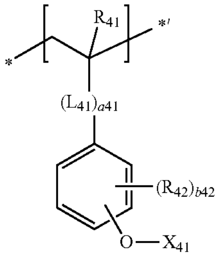

In Formulae 4-1 and 4-2, $L_{41}$ and $X_{41}$ may be each the same as defined in Formula 4; a41 may be selected from among integers of 1 to 4; $R_{42}$ may be hydrogen or a $C_1$-$C_{10}$ linear; branched or cyclic monovalent hydrocarbon group; b42 may be selected from among integers of 1 to 4; and * and *' may each be a bonding site with a neighboring atom.

In at least one embodiment, the polymer may consist of the first repeating unit and the third repeating unit. For example, the polymer may include about 1 mol % to about 90 mol % of the third repeating unit and about 10 mol % to about 99 mol % of the first repeating unit; and/or about 10 mol % to about 80 mol % of the third repeating unit and about 20 mol % to about 90 mol % of the first repeating unit.

In another embodiment, the polymer may consist of the second repeating unit and the third repeating unit. For example, the polymer may include about 1 mol % to about 90 mol % of the third repeating unit and about 10 mol % to about 99 mol % of the second repeating unit; and/or include about 10 mol % to about 80 mol % of the third repeating unit and about 20 mol % to about 90 mol % of the second repeating unit.

The polymer may have a weight average molecular weight (Mw) of about 1,000 to about 500,000, specifically, about 3,000 to about 200,000, as measured by gel permeation chromatography using tetrahydrofuran solvent and polystyrene standards.

The polymer may have a polydispersity index (PDI: Mw/Mn) of about 1.0 to about 3.0, and/or about 1.0 to about 2.0. When the polymer has a weight average molecular weight within the above ranges, control over dispersibility and/or compatibility of the polymer may be easier, foreign materials may be less likely to remain on patterns, or degradations in pattern profiles may be minimized. Accordingly, the resist composition may be rendered more suitable to form micropatterns.

Without being limited to any particular theory, by heat and/or a high-energy beam, the polymer may form radicals at carbons linked to $R_{13}$ or $R_{14}$ and carbons linked to $R_{23}$ or $R_{24}$. By a high-energy beam, the above radicals may form chemical bonds with radicals within a neighboring polymer, thereby forming crosslinks between the polymers. Such crosslinks may cause a change to physical properties of the polymer, in particular, solubility with respect to a developer.

Since the polymer may have its own physical properties changed by a high-energy beam, the polymer may be used in a non-chemically amplified resist composition.

Since the polymer has a relatively high resistance to oxygen and/or moisture, and may only change its physical properties by a high-energy beam, the polymer may provide a resist composition having improved storage stability (and/or the like).

Since the polymer allows changes in physical properties of the polymer to be induced by crosslinking, the polymer may provide a resist composition which enables patterning at a relatively low dose of a high-energy beam compared to a system that induces changes in physical properties by disintegrating the polymer backbone.

The polymer may be prepared by any suitable method. For example, the polymer may be prepared by dissolving unsaturated bond-containing monomer(s) in an organic solvent, followed by thermal polymerization in the presence of a radical initiator.

The structure (composition) of the polymer may be identified by performing FT-IR analysis, NMR analysis, fluorescence X-ray (XRF) analysis, mass spectrometry, UV analysis, single crystal X-ray structure analysis, powder X-ray diffraction (PXRD) analysis, liquid chromatography (LC) analysis, size exclusion chromatography (SEC) analysis, thermal analysis, and the like. Specific methods of identification are as described in Examples.

Resist Composition

According to another aspect, provided is a resist composition including the above-described polymer and an organic solvent. The resist composition may have improved sensitivity characteristics.

The resist composition may change its solubility with respect to a developer by exposure with a high-energy beam. The resist composition may be a negative-type resist composition which forms a negative-type resist pattern by dissolution and removal of an unexposed portion of a resist film.

In addition, a sensitive-type resist composition according to at least one embodiment may be for an alkaline development process that utilizes an alkaline developer for a development treatment during resist pattern formation, and may be for a solvent development process that utilizes a developer including an organic solvent (hereinafter referred to as an organic developer) in such a development treatment.

Since the resist composition is a non-chemically amplified type, a photoacid generator may be substantially omitted.

Since the polymer changes its properties by exposure, the resist composition may not substantially contain a compound of a molecular weight of 1,000 or more, other than the polymer.

Since the polymer is as described above, organic solvents and optional components that may be included as necessary will be described hereinbelow. In addition, the polymer used in the resist composition may be a single type of polymer, or a combination of two or more different types of polymers.

<Organic Solvent>

An organic solvent included in the resist composition may be any organic solvent capable of dissolving or dispersing a polymer and optional components (and the like), that may be included as necessary (or otherwise desired). The organic solvent used may be a single type of organic solvent, or a combination of two or more different types of organic solvents. Alternatively, a mixed solvent containing water and an organic solvent may be used.

Examples of the organic solvent may include alcohol-based solvents, ether-based solvents, ketone-based solvents, amide-based solvents, ester-based solvents, sulfoxide-based solvents, hydrocarbon-based solvents; and/or the like.

Examples of the alcohol-based solvent may include: a monohydric alcohol-based solvent (such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, secoctanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, diacetone alcohol, etc.); a polyhydric alcohol-based solvent (such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, etc.); and/or a polyhydric alcohol-containing ether-based solvent (such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, etc.); and/or the like.

Examples of the ether-based solvent may include: a dialkyl ether-based solvent (such as diethyl ether, dipropyl ether, dibutyl ether, etc.); a cyclic ether-based solvent (such as tetrahydrofuran, tetrahydropyran, etc.); an aromatic ring-containing ether-based solvent (such as diphenyl ether, anisole, etc.); and/or the like.

Examples of the ketone-based solvent may include: a chain ketone-based solvent (such as acetone, methyl ethyl ketone, methyl-n-propyl ketone, methyl-n-butyl ketone, diethyl ketone, methyl isobutyl ketone, 2-heptanone, ethyl-n-butyl ketone, methyl-n-hexyl ketone, diisobutyl ketone, trimethyl nonanone, etc.); a cyclic ketone-based solvent (such as cyclopentanone, cyclohexanone, cycloheptanone, cyclo-octanone, methylcyclohexanone, etc.); 2,4-pentanedione; acetonylacetone; acetophenone; and/or the like.

Examples of the amide-based solvent may include: a cyclic amide-based solvent (such as N,N'-dimethylimidazolidinone, N-methyl-2-pyrrolidone, etc.); a chain amide-based solvent (such as N-methylformamide, N,N-dimethylformamide, N,N-diethylformamide, acetamide, N-methylacetamide, N,N-dimethylacetamide, N-methylpropionamide, etc.); and/or the like.

Examples of the ester-based solvent may include: an acetate ester-based solvent (such as methyl acetate, ethyl acetate, n-propyl acetate, isopropyl acetate, n-butyl acetate, isobutyl acetate, sec-butyl acetate, n-pentyl acetate, isopentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, etc.); a polyhydric alcohol-containing ether carboxylate-based solvent (such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, etc.); a carbonate-based solvent (such as dimethyl carbonate, diethyl carbonate, ethylene carbonate, propylene carbonate, etc.); a lactate ester-based solvent (such as methyl lactate, ethyl lactate, n-butyl lactate, n-amyl lactate, and the like; and glycol diacetate, methoxytriglycol acetate, ethyl propionate, n-butyl propionate, isoamyl propionate, diethyloxalate, di-n-butyloxalate, methyl acetoacetate, ethyl acetoacetate, diethyl malonate, dimethyl phthalate, diethyl phthalate, etc.); and/or the like.

Examples of the sulfoxide-based solvent may include dimethyl sulfoxide, diethyl sulfoxide, and/or the like.

Examples of the hydrocarbon-based solvent include: an aliphatic hydrocarbon-based solvent (such as n-pentane, isopentane, n-hexane, isohexane, n-heptane, isoheptane, 2,2,4-trimethyl pentane, n-octane, isooctane, cyclohexane, methylcyclohexane, etc.); an aromatic hydrocarbon-based solvent such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, n-amylnaphthalene, etc.); and/or the like.

In at least one embodiment, the solvent may be selected from among an alcohol-based solvent, an amide-based solvent, an ester-based solvent, a sulfoxide-based solvent, and/or a combination thereof. For example, the solvent may be selected from among propylene glycol monomethyl ether, propylene glycol monoethyl ether, propylene glycol monomethyl ether acetate, N-methyl-2-pyrrolidone, N,N-dimethylacetamide, ethyl lactate, dimethylsulfoxide, and/or a combination thereof.

The organic solvent may be used in an amount of about 200 to about 5,000 parts by weight, in particular, about 400 parts by weight to about 3,000 parts by weight, with respect to 100 parts by weight of the polymer.

<Optional Components>

The resist composition may further include, as necessary (or otherwise desired), a surfactant, a crosslinking agent, a levelling agent, a coloring agent, and/or a combination thereof.

The resist composition may further include a surfactant in order to improve coatability, development properties, and/or the like. Specific examples of the surfactant may include nonionic surfactants, such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, polyethylene glycol distearate, and the like. The surfactant used may be a commercially available product and/or a synthesized product. Examples of the commercially available surfactant product may include KP341 (manufactured by Shin-Etsu Chemical Co., Ltd.), Polyflow No.75 and Polyflow No.95 (manufactured by Kyoeisha Chemical Co., Ltd.), Ftop EF301, Ftop EF303, and Ftop EF352 (manufactured by Mitsubishi Material Electrochemical Co., Ltd.), MEGAFACE (registered trademark) F171, MEGAFACE F173, R40, R41, and R43 (manufactured by DIC Corp. Ltd.), Fluorad (registered trademark) FC430 and Fluorad FC431 (manufactured by 3M Co., Ltd.), AsahiGuard AG710 (manufactured by AGC Co., Ltd.), Surflon (registered trademark) S-382, Surflon SC-101, Surflon SC-102, Surflon SC-103, Surflon SC-104, Surflon SC-105, and Surflon SC-106 (manufactured by AGC Semi Chemical Co., Ltd.), and/or the like.

The surfactant may be included in an amount of about 0 part by weight to about 20 parts by weight with respect to 100 parts by weight of the polymer. The surfactant used may be a single type of surfactant, or a mixture of two or more different types of surfactants.

The method by which the resist composition is prepared is not limited to any particular method. For example, the resist composition may be prepared by mixing a polymer and optional components added as needed in an organic solvent. The temperature or duration for the mixing is not particularly limited. Filtration may be performed after the mixing, if necessary.

Method of Forming a Pattern

Figure 2:
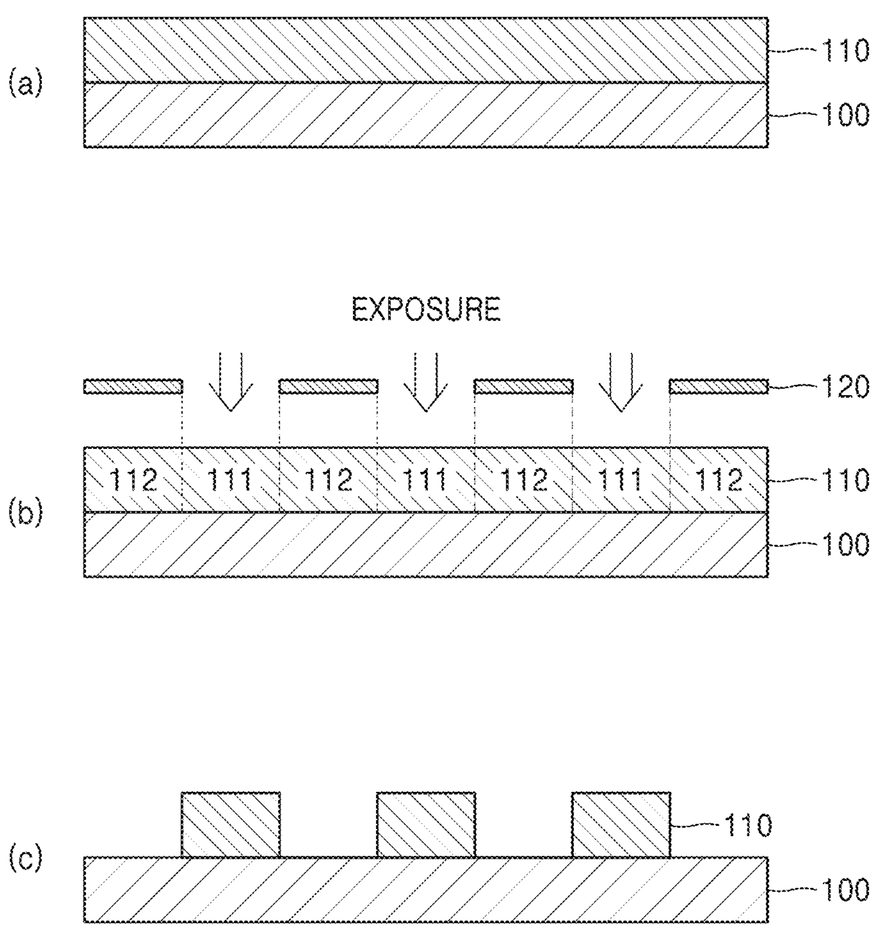
FIG. 2 is a side cross-sectional view showing a pattern forming method according to at least one embodiment.

Hereinbelow, referring to FIGS. 1 and 2, a pattern forming method according to embodiments is described in greater detail. FIG. 1 is a flowchart showing a pattern forming method according to embodiments, and FIG. 2 is a side sectional view representing a pattern forming method according to embodiments. Hereinbelow, a pattern forming method using a negative resist composition, as an example, is described in detail, but is not limited thereto.

Referring to FIG. 1, a pattern forming method may include the processes of forming a resist film by applying a resist composition (S101), exposing at least a portion of the resist film by a high-energy beam (S102), and developing the exposed resist film by using a developer (S103). The above processes may be omitted as necessary, and/or may be carried out in a different sequence.

First, a substrate 100 may be prepared. For example, the substrate 100 may utilize a semiconductor substrate (such as a silicon substrate, a germanium substrate, etc.), and/or may be formed of (and/or include) glass, quartz, ceramics, copper, and/or the like. In some examples, the substrate 100 may include a compound of Group III-V (such as GaP, GaAs, GaSb, etc.) and/or the like.

A resist film 110 may be formed on the substrate 100 by applying the resist composition to a specific desired thickness by a coating method. As necessary, heating, prebaking (PB) may be performed to remove organic solvents remaining on the resist film 110. Also, the resist film 110 may be heated to generate radicals, and then, the radicals may be chemically crosslinked by exposure to form crosslinks.

The coating method may utilize spin coating, dipping, roller coating, and/or other common coating methods. Among such coating methods, spin coating in particular may be utilized. In particular, the resist film 110 may be formed to a desired thickness by adjusting the viscosity, concentration, and/or spin speed of the resist composition. Specifically, the resist film 110 may have a thickness of about 10 nm to about 300 nm. More specifically, the resist film 110 may have a thickness of about 30 nm to about 200 nm.

The lower limit of PB temperature may be 60° C. or more, and/or 80° C. or more; and the upper limit of PB temperature may be 150° C. or less, and/or 140° C. or less. The lower limit of PB duration may be 5 seconds or more and/or 10 seconds or more. The upper limit of PB duration may be 600 seconds or less and/or 300 seconds or less. In at least some embodiments, excessive heat and/or baking may result in deterioration of pattern precision due to, e.g., degradation of the photoresist composition.

Prior to applying the resist composition onto the substrate 100, a target etch film (not illustrated) may be further formed on the substrate 100. The etch target film may refer to a layer that has an image transferred from a resist pattern and thus transforms to a pattern. In at least one embodiment, the etch target film may be formed to include an insulating material (such as silicon oxide, silicon nitride, silicon oxynitride, and/or the like). In some examples, the etch target film may be formed to include a conductive material (such as a metal, metal nitride, metal silicide, metal silicide nitride, and/or the like film). In some examples, the etch target film may be formed to include a semiconductor material (such as poly silicon).

In at least one embodiment, there may be an anti-reflection film further formed on the substrate 100 to maximally achieve the efficiency of resist. The anti-reflection film may be (or include) an organic and/or inorganic-based anti-reflection film.

In at least one embodiment, there may be a protection film further provided on the resist film 100 to reduce the influence of alkaline impurities, etc. that are included during a process. In addition, in a case in which immersion lithography is conducted, for example, an immersion protection film may be provided on the resist film 110 to avoid direct contact between immersion media and the resist film 110.

Next, at least a portion of the resist film 110 may be exposed by a high-energy beam. For example, a high-energy beam having passed through a mask 120 may be irradiated to at least a portion of the resist film 110. As a result, the resist film 110 may have an exposed portion 111 and an unexposed portion 112.

Without being limited to any particular theory, there may be radicals generated in the exposed portion 111 by exposure, and chemical bonds between the radicals may be formed, thereby forming crosslinks.

Such an exposure, in some cases, may be conducted by irradiating a high-energy beam through a mask having a pattern while using liquid, such as water, as media. Examples of the high-energy beam may include electromagnetic waves such as ultraviolet rays, deep ultraviolet rays (DUV), extreme ultraviolet rays (EUV, wavelength 13.5 nm), X-rays, and γ-rays; and charged particle beams, such as an electron beam (EB), α-ray, and/or the like. Irradiation of such high-energy beams may be referred to as "exposure".

Examples of exposure light source may include: laser radiation in the ultraviolet region, such as KrF excimer laser (wavelength 248 nm), ArF excimer laser (wavelength 193 nm), and $F_2$ excimer laser (wavelength 157 nm); harmonic laser radiation in the far-infrared region or vacuum ultraviolet region, through wavelength conversion from laser light from solid-state laser light sources (YAG or semiconductor laser, etc.); an electron beam or extreme ultraviolet (EUV) radiation, and/or the like. During exposure, exposure is commonly carried out through a mask that corresponds to a desired pattern. However, when the light source of exposure is an electron beam, the exposure may be carried out by direct writing, without using a mask.

An appropriate dose of high-energy beam, for example, when extreme ultraviolet rays are used as the high-energy beam, may be 2,000 $mJ/cm^2$ or less (more specifically, 500 $mJ/cm^2$ or less). In addition, when using an electron beam as the high-energy beam, an appropriate dose may be 5,000 $\mu C/cm^2$ or less (more specifically, 1,000 $\mu C/cm^2$ or less).

In addition, post-exposure bake (PEB) may be carried out following the exposure. The lower limit of PEB temperature may be 50° C. or more and/or 80° C. or more. The upper limit of PEB temperature may be 180° C. or less and/or 130° C. or less. The lower limit of PEB duration may be 5 seconds or more, in particular, 10 seconds or more. The upper limit of PEB duration may be 600 seconds or less, in particular, 300 seconds or less.

Next, the exposed resist film 110 may be developed using a developer. The unexposed portion 112 may be washed away by the developer, while the exposed portion 111 remains without being washed away by the developer.

Examples of the developer may include an alkaline developer, a developer containing an organic solvent (hereinafter referred to as "organic developer") and the like. Examples of development methods may include a dipping process, a puddle process, a spray process, a dynamic dispense process, and/or the like. The development temperature may be, for example, from about 5° C. to about 60° C. The developing time may be, for example, from about 5 seconds to about 300 seconds.

Examples of the alkaline developer may include an alkaline aqueous solution that has dissolved therein at least one alkaline compound (e.g., selected from among sodium hydroxide, potassium hydroxide, sodium carbonate, sodium silicate, sodium metasilicate, ammonia water, ethylamine, n-propylamine, diethylamine, di-n-propyl amine, triethylamine, methyldiethylamine, ethyldimethylamine, triethanolamine, tetramethyl ammonium hydroxide (TMAH), pyrrole, piperidine, choline, 1,8-diazabicyclo[5.4.0]-7-undecene (DBU), 1,5-diazabicyclo[4.3.0]-5-nonene (DBN), and/or the like). The alkaline developer may further include a surfactant.

The lower limit of the content of the alkaline compound in the alkaline developer may be 0.1 mass % or more; 0.5 mass % or more, and/or more specifically, 1 mass % or more. In addition, the upper limit of the content of the alkali compound in the alkaline developer may be 20 mass % or less, 10 mass % or less, and/or more specifically, 5 mass % or less.

For the organic solvent included in the organic developer, the same organic solvent presented as an example in <Organic Solvent> under [Resist Composition] section above may be used. For example, the organic developer may include nBA (n-butyl acetate), PGME (propylene glycol methyl ether), PGMEA (propylene glycol methyl ether acetate), GBL (γ-butyrolactone), IPA (isopropanol), and/or the like.

The lower limit of the content of the organic solvent in the organic developer may be 80 mass % or more, 90 mass % or more, 95 mass % or more, and/or more specifically, may be 99 mass % or more.

The organic developer may include the surfactant. In addition, the organic developer may contain a trace amount of moisture. In addition, during the development, the organic developer may be replaced with another type of solvent to thereby stop the development.

The resist pattern after development may be further washed. As a washing solution, distilled water, a rinsing solution, etc. may be used. The rinsing solution is not particularly limited as long as it does not dissolve resist patterns, and may be a solution containing a common organic solvent. Examples of the rinsing solution may include an alcohol-based solvent and an ester-based solvent. After washing, the rinsing solution remaining on the substrate and patterns may be removed. In particular, when distilled water was used, water residues on the substrate and pattern may be removed.

In addition, the developer used may be a single type of developer or a combination of two or more types of developers.

By etching after forming the resist pattern as described above, a patterned wiring substrate may be obtained. The etching may be performed by a known method, such as a dry etching process using plasma gas and a wet etching process using an alkaline solution, a copper(II) chloride solution, an iron(II) chloride solution, and the like.

After forming the resist pattern, plating may be performed. The plating method is not particularly limited and may include copper plating, solder plating, nickel plating, gold plating, and/or the like.

Resist pattern residues after etching may be stripped by an organic solvent. Examples of such organic solvents are not particularly limited and may include, for example, propylene glycol monomethyl ether acetate (PGMEA), propylene glycol monomethyl ether (PGME), ethyl lactate (EL), and/or the like. The stripping method is not particularly limited and may include a dipping method, a spray method, and/or the like. In addition, a wiring board having the resist pattern formed thereon may be a multilayer wiring board and may have a small-diameter via hole.

In at least one embodiment, the wiring board may be formed through a lift-off method in which after a resist pattern is formed, metal is deposited under vacuum, and then the resist pattern is dissolved with a solution.

The present inventive concepts will be described in greater detail with reference to Examples and Comparative Examples below, but the technical scope of the present inventive concepts is not limited to the following Examples.

EXAMPLES

Synthesis Example 1

Synthesis of P(VBS·Cl)

(1) Synthesis of VBS·Cl

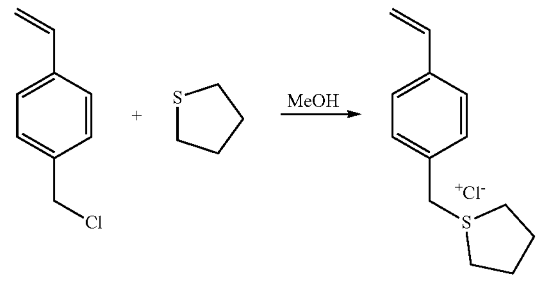

Figure 3A:
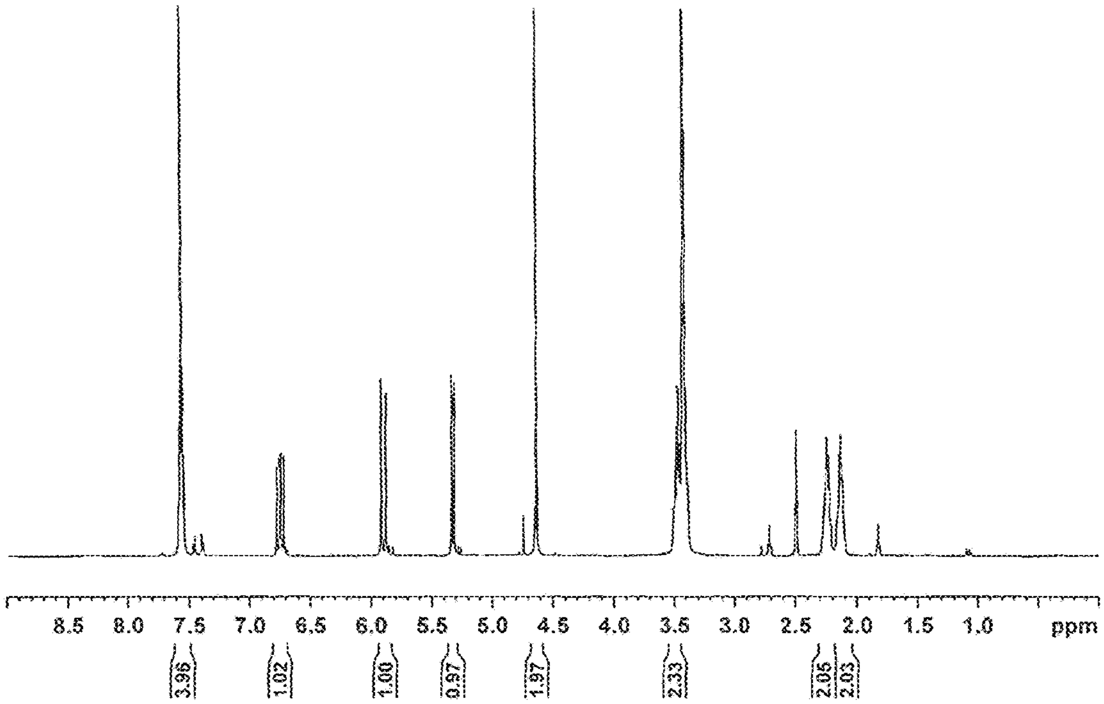
FIG. 3A shows an $^1$H-nuclear magnetic resonance (NMR) spectrum of vinyl benzyl thiolane chloride (VBS·Cl.)

Vinylbenzyl chloride (VBC) (10 grams (g), 65.5 mmol) and tetrahydrothiophene (8.7 grams (g), 98.3 mmol) were placed in a round-bottom flask and dissolved in 200 mL of methanol. The resulting mixture was reacted at 50° C. for 24 hours and then precipitated with diethyl ether. The precipitates were dried at room temperature for 24 hours to thereby produce vinyl benzyl thiolane chloride (VBS·Cl) monomers. The VBS·Cl monomers thus obtained were analyzed by $^1$H-NMR, and the results thereof are shown in FIG. 3A.

(2) Synthesis of P(VBS·Cl)

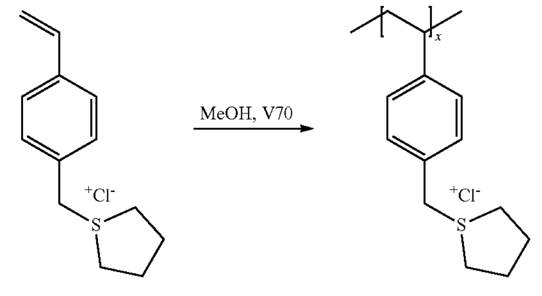

Figure 3B:
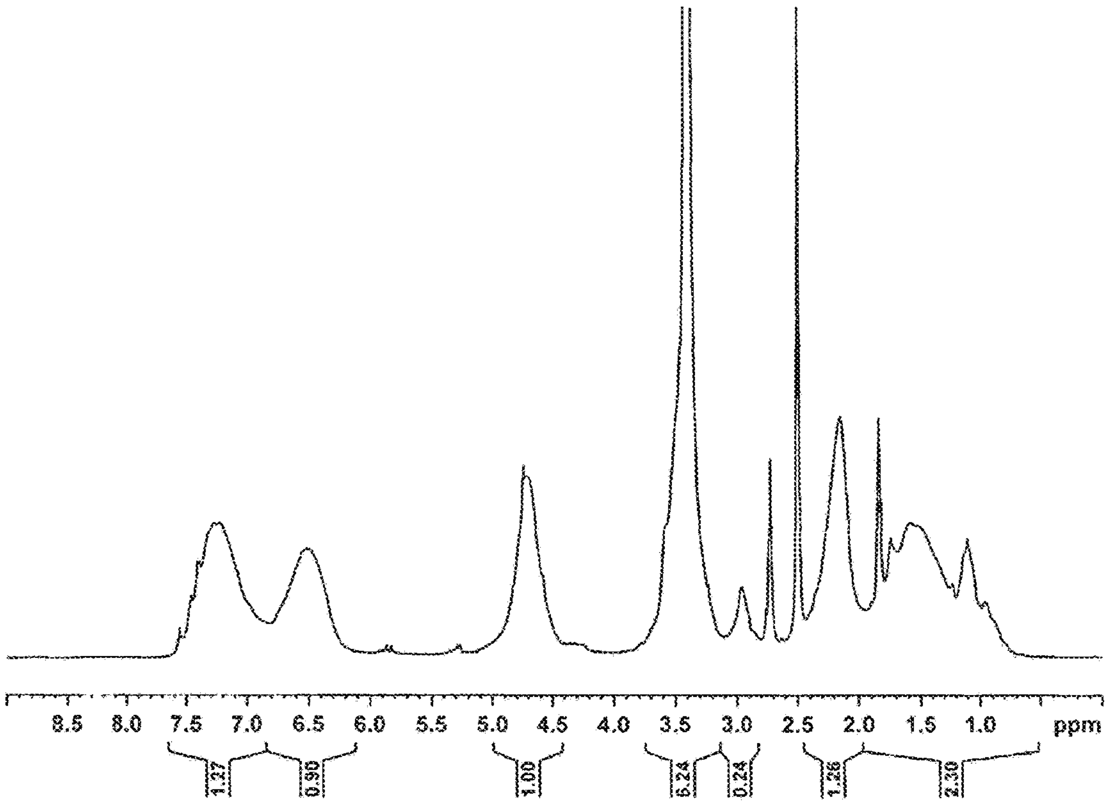
FIG. 3B shows an $^1$H-NMR spectrum of polymerized VBS·Cl (P(VBS·Cl))

VBS·Cl(1 grams (g), 4.2 mmol) and V70 (0.13 grams (g), 0.4 mmol) were placed in a vial and dissolved in 5 mL of methanol. The resulting mixture was reacted at 40° C. for 24 hours and then precipitated with diethylether, to synthesize P(VBS·Cl) polymer. The P(VBS·Cl) polymer thus obtained was analyzed by $^{1}$H-NMR, and the results thereof are shown in FIG. 3B.

Synthesis Example 2

Synthesis of P(VBS·OTf)

(1) Synthesis of VBS·OTf

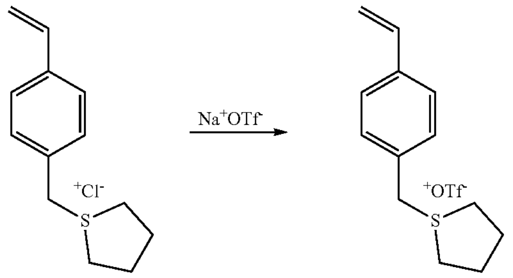

Figure 4A:
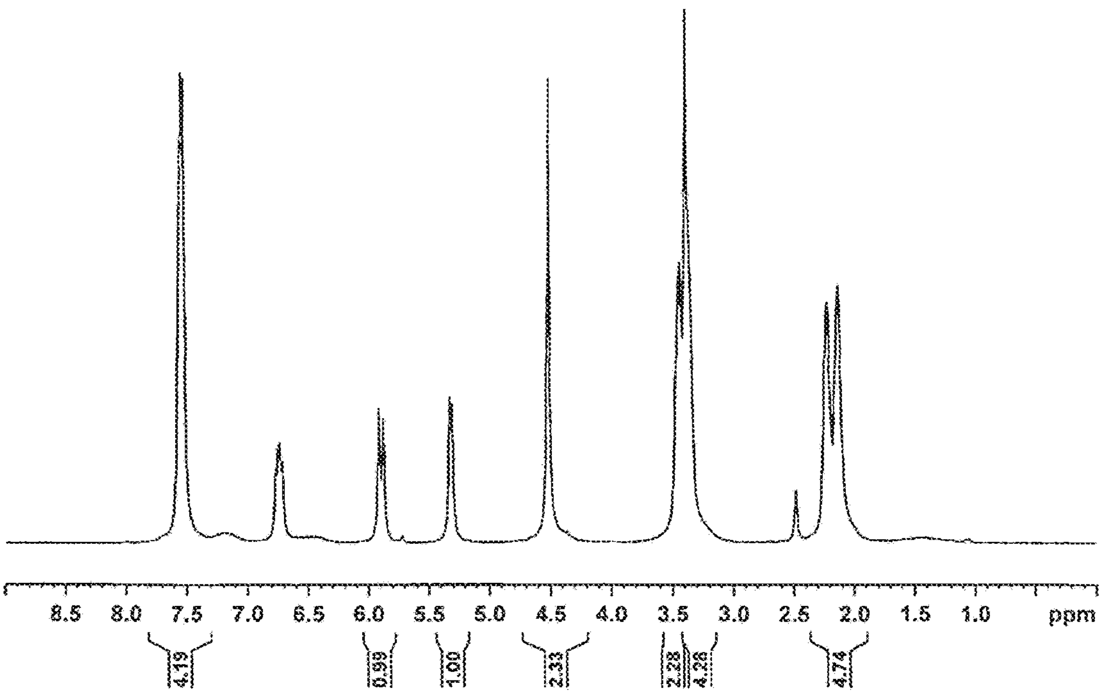
FIG. 4A shows an $^1$H-NMR spectrum of VBS·OTf.

VBS·Cl (5 grams (g), 20.8 mmol) obtained from the synthesis of VBS·Clin Synthesis Example 1, and sodium trifluoromethanesulfonate (NaOTf) (7.2 grams (g), 41.5 mmol) were dissolved in water and then reacted for 4 hours at room temperature. The precipitates obtained upon completion of the reaction were washed with diethylether to produce VBS·OTf monomers. The VBS·OTf monomers thus obtained were analyzed by $^{1}$H-NMR, and the results thereof are shown in FIG. 4A.

(2) Synthesis of P(VBS·OTf)

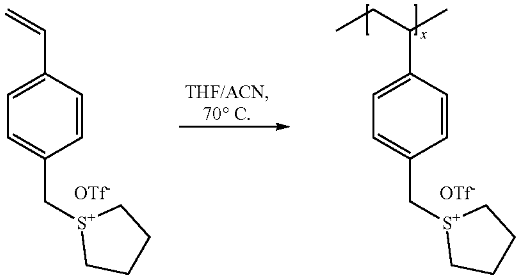

Figure 4B:
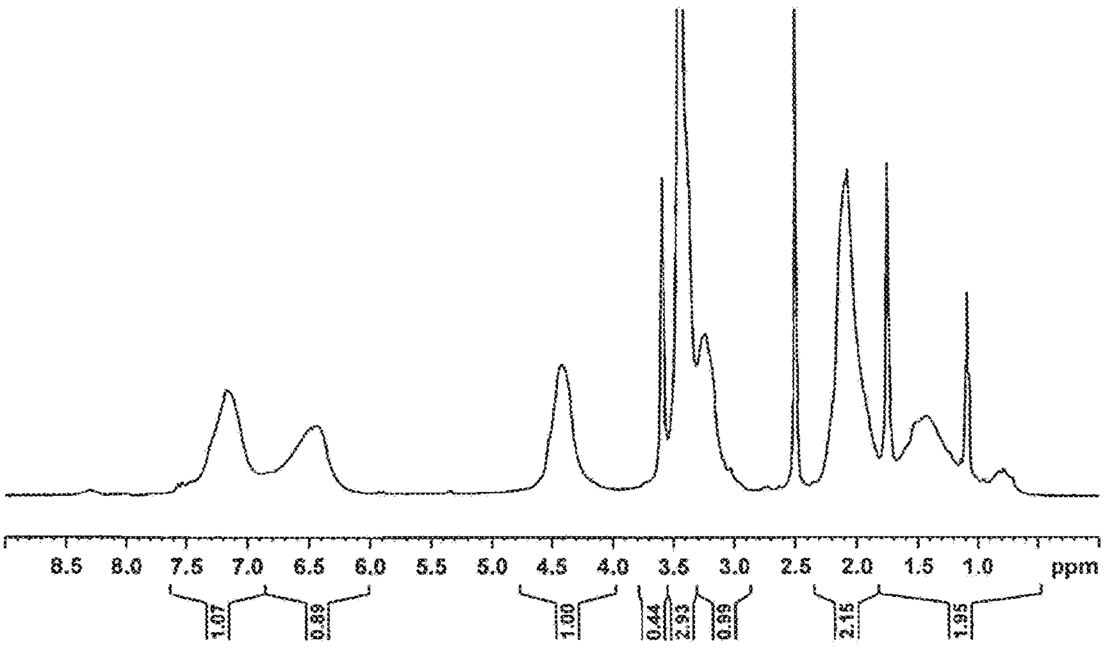
FIG. 4B shows an $^1$H-NMR spectrum of P(VBS·OTf)

VBS·OTf (2 grams (g), 5.6 mmol) and dimethyl 2,2'-axobis(2-methyliprpionate) (V601 (0.065 grams (g), 0.3 mmol)) were placed in a vial and dissolved in 10 mL of tetrahydrofuran (THF)/acetonitrile (ACN)(50/50, v/v). The resulting mixture was reacted at 70° C. for 24 hours and then precipitated with diethyl ether, to synthesize P(VBS·OTf) polymer. The P(VBS·OTf) polymer thus obtained was analyzed by $^{1}$H-NMR, and the results thereof are shown in FIG. 4B.

Synthesis Example 3

Synthesis of P(VBC)

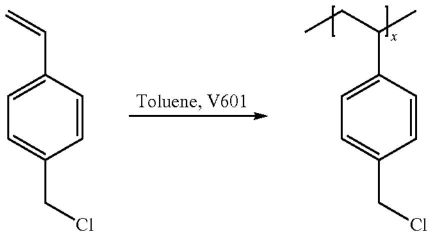

Figure 5:
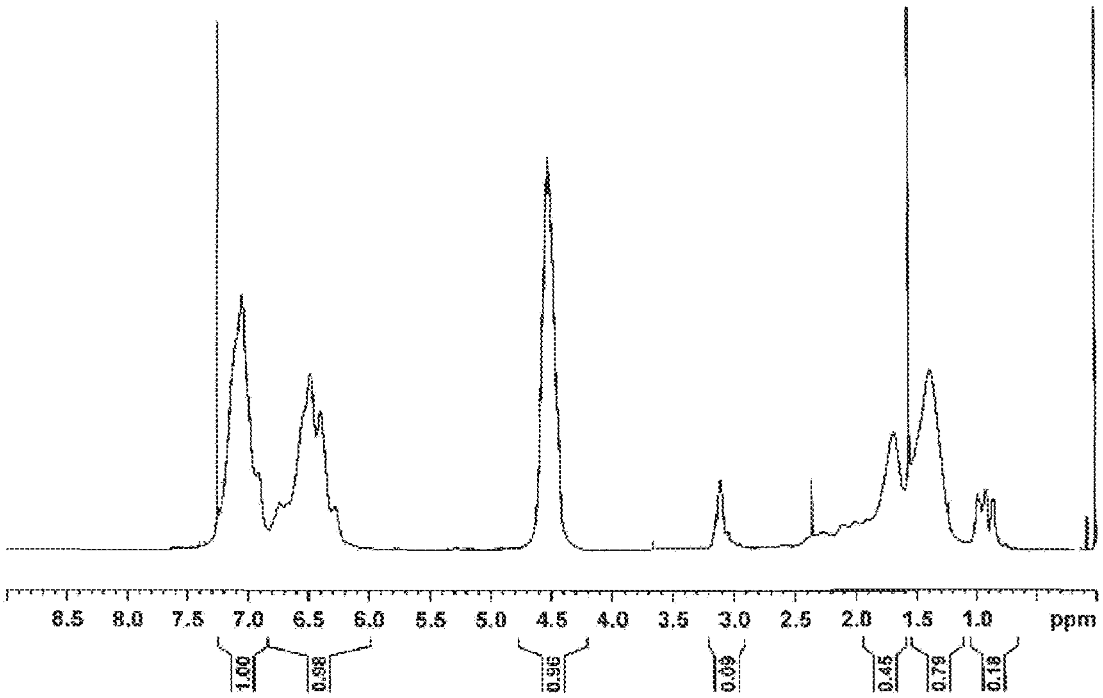
FIG. 5 shows an $^1$H-NMR spectrum of polymerized vinyl benzyl chloride P(VBC)

VBC (2 grams (g), 13.1 mmol) and V601 (0.15 grams (g), 0.7 mmol) were placed in a vial and dissolved in 10 mL of toluene. The resulting mixture was reacted at 70° C. for 24 hours and then precipitated with methanol (MeOH), to synthesize P(VBC) polymer. The P(VBC) polymer thus obtained was analyzed by $^{1}$H-NMR, and the results thereof are shown in FIG. 5.

Synthesis Example 4

Synthesis of P(VBS·Cl/VBC)

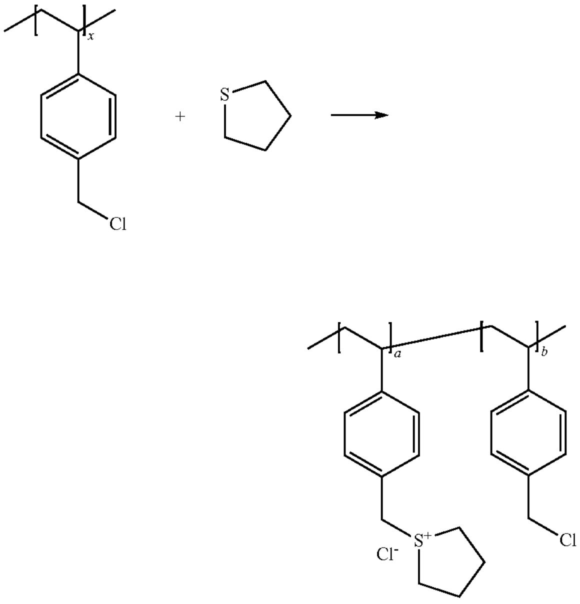

Figure 6:
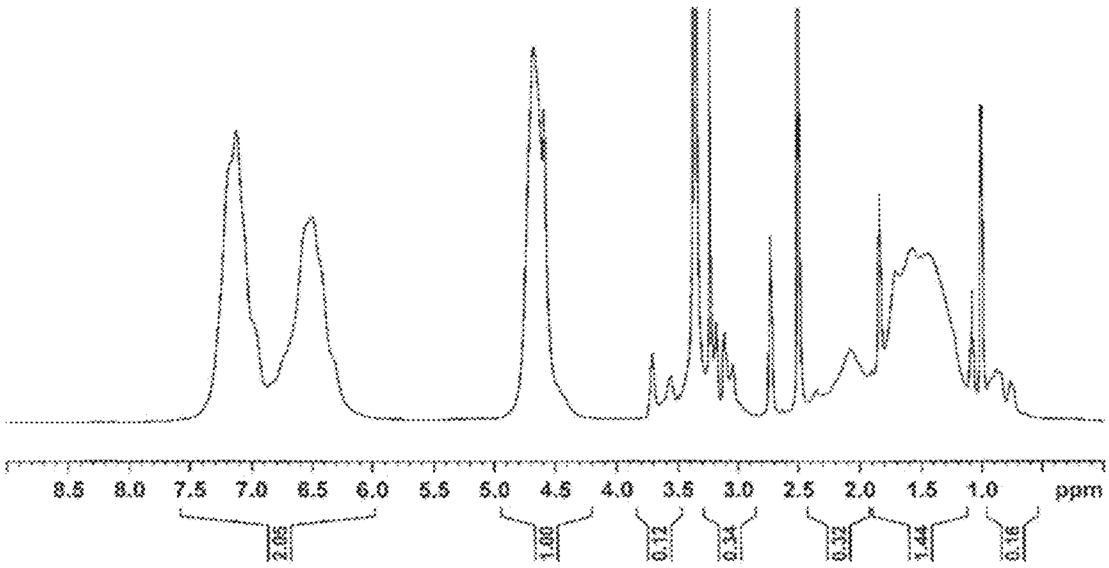
FIG. 6 shows an $^1$H-NMR spectrum of P(VBS·Cl/VBC) (=16/84)

1 g of P(VBC) and 1 g of tetrahydrothiophene were dissolved in propylene glycol methyl ether (PGME), and then reacted at 50° C. for 24 hours. The reaction products were precipitated with diethyl ether and then dried to produce P(VBS·Cl/VBC) polymer, of which 16 mol % was substituted with sulfonium. The P(VBS·Cl/VBC)(=16/84) polymer thus obtained was analyzed by $^{1}$H-NMR, and the results thereof are shown in FIG. 6.

Synthesis Example 5

Synthesis of P(VBS·OTf/NLMA)

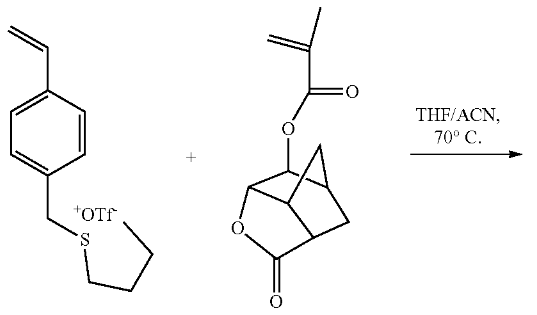

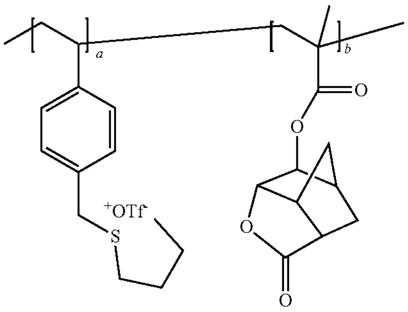

Figure 7:
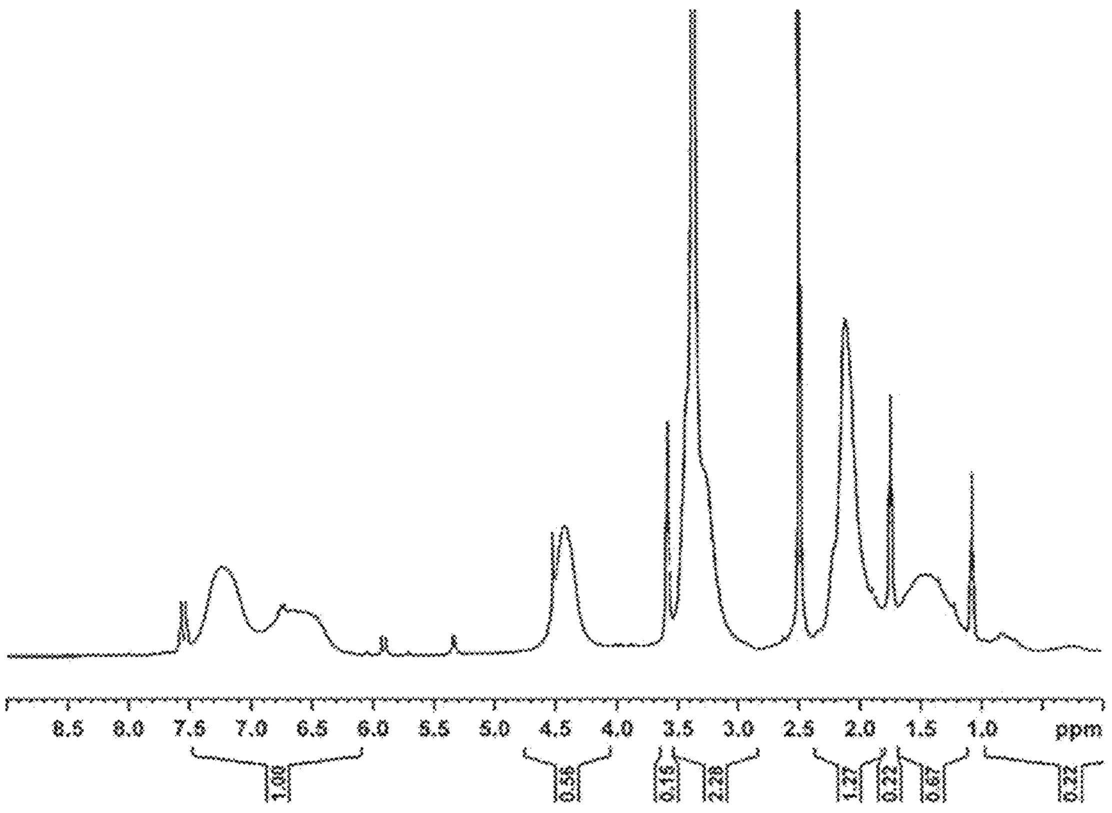
FIG. 7 shows an $^1$H-NMR spectrum of P(VBS·OTf/NLMA) (=89/11)

VBS·OTf (1.5 grams (g), 4.2 mmol), 2-methacryloyloxy-4-oxatricyclo[4.2.1.0]nonan-5-one (NLMA) (0.235 grams (g), 1.1 mmol), and V601 (0.06 grams (g), 0.3 mmol) were dissolved in 10 mL of THF/ACN (5/5, v/v). The resulting mixture was reacted at 70° C. for 24 hours and then precipitated with diethyl ether, to synthesize P(VBS·OTf/NLMA) (=89/11) polymer. The P(VBS·OTf/NLMA)(=89/11) polymer thus obtained was analyzed by $^1$H-NMR, and the results thereof are shown in FIG. 7.

Synthesis Example 6

Synthesis of P(VBS·OTf/VBC)

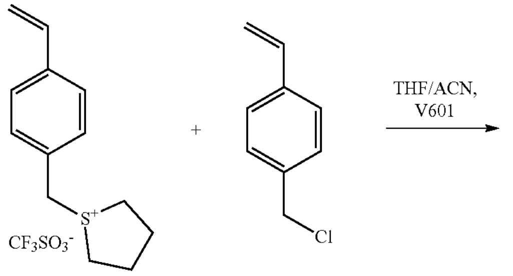

-continued

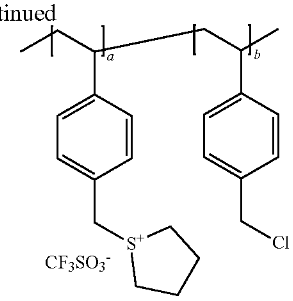

Figure 8:
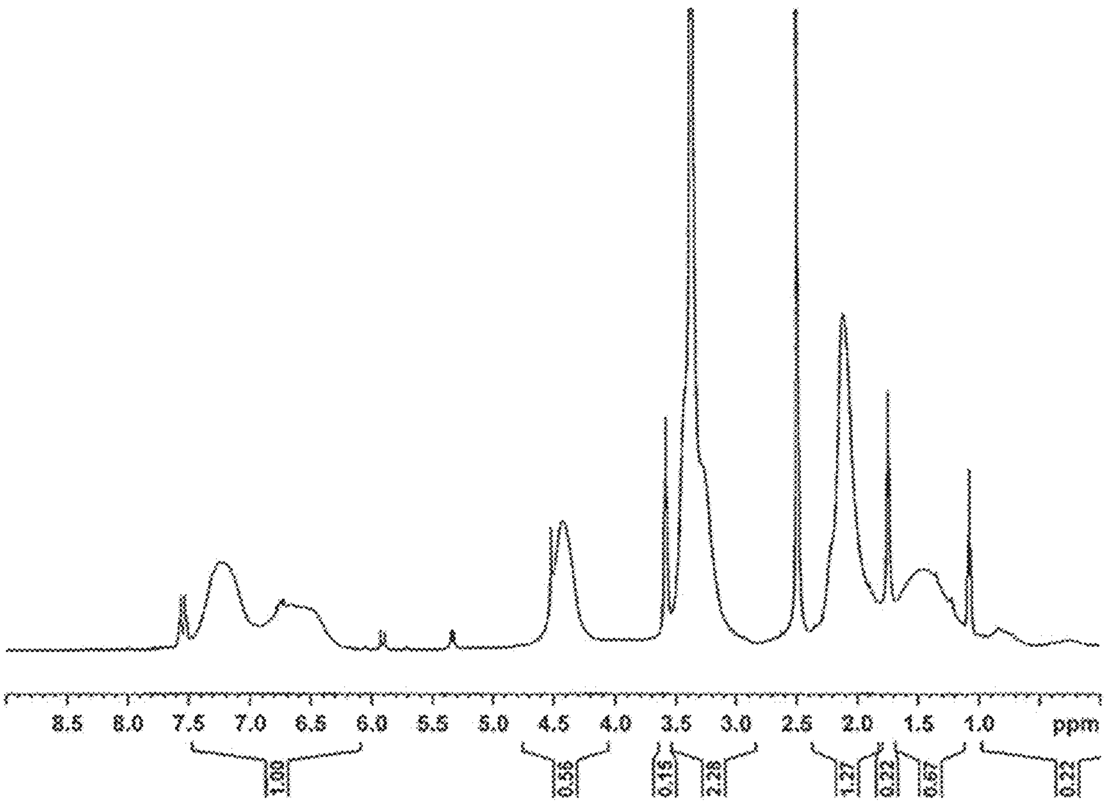
FIG. 8 shows an $^1$H-NMR spectrum of P(VBS·OTf/VBC) (=22/78)
Figure 9A:
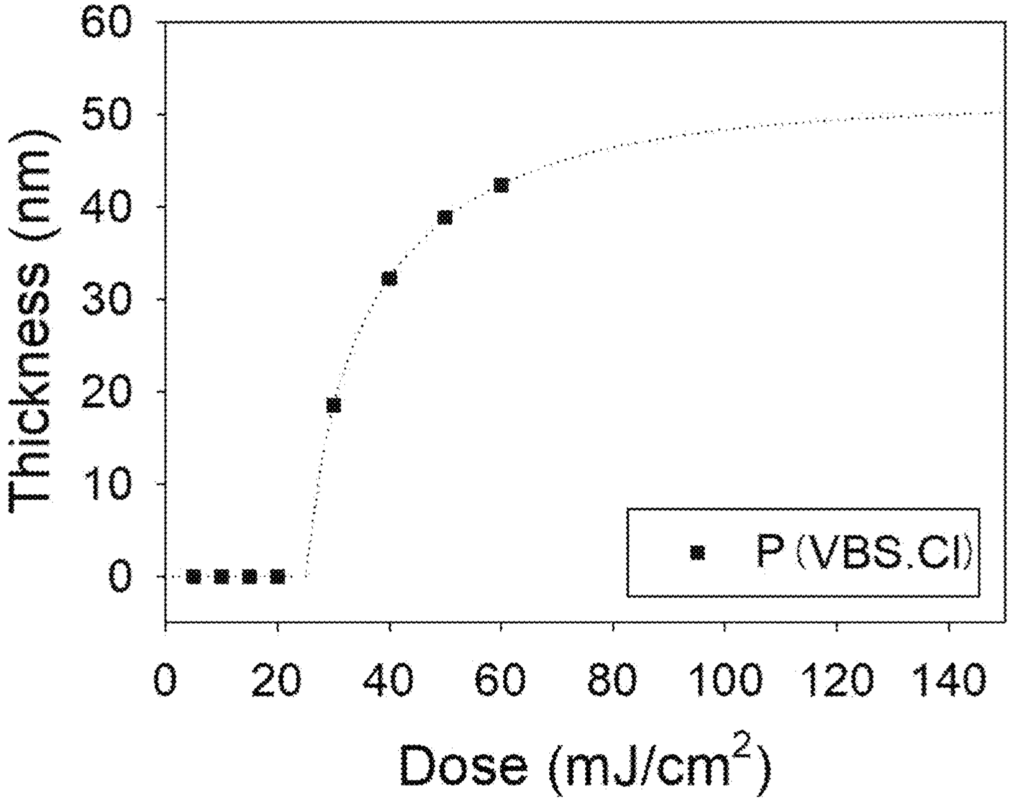
FIGS. 9A to 9F show post-development changes in film thickness according to doses in P(VBS·Cl), P(VBS·OTf), P(VBC), P(VBS·Cl/VBC), P(VBS·OTf/NLMA), and P(VBS·OTf/VBC), respectively.
Figure 9B:
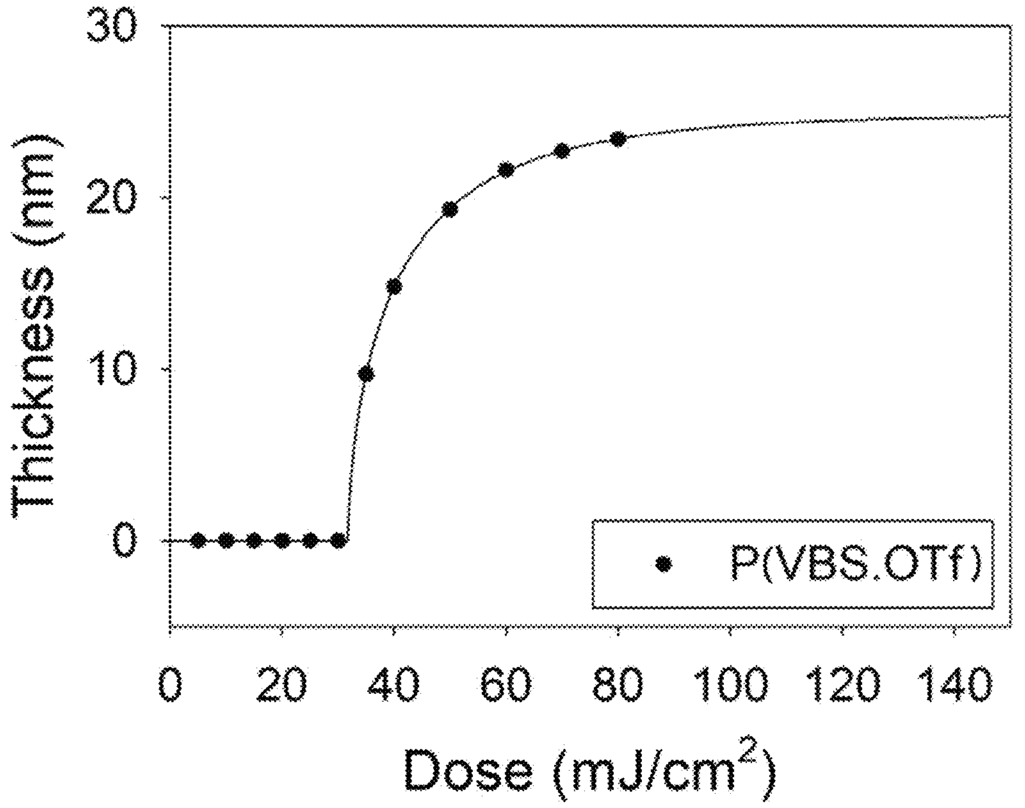
Figure 9C:
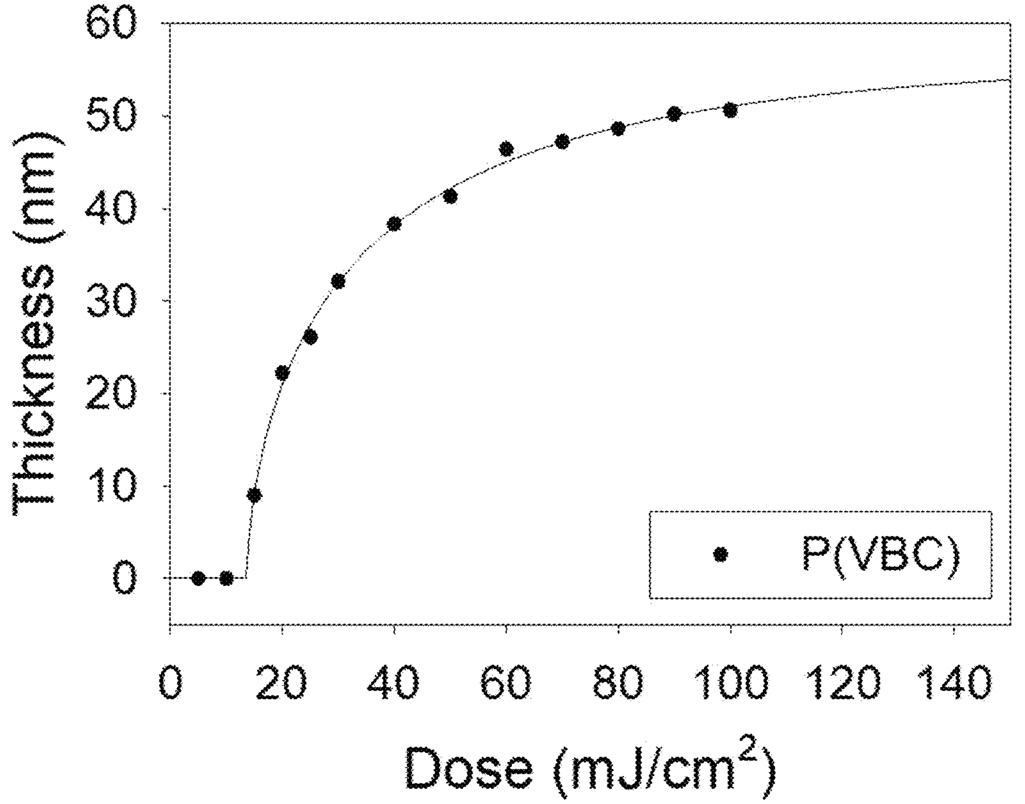
Figure 9D:
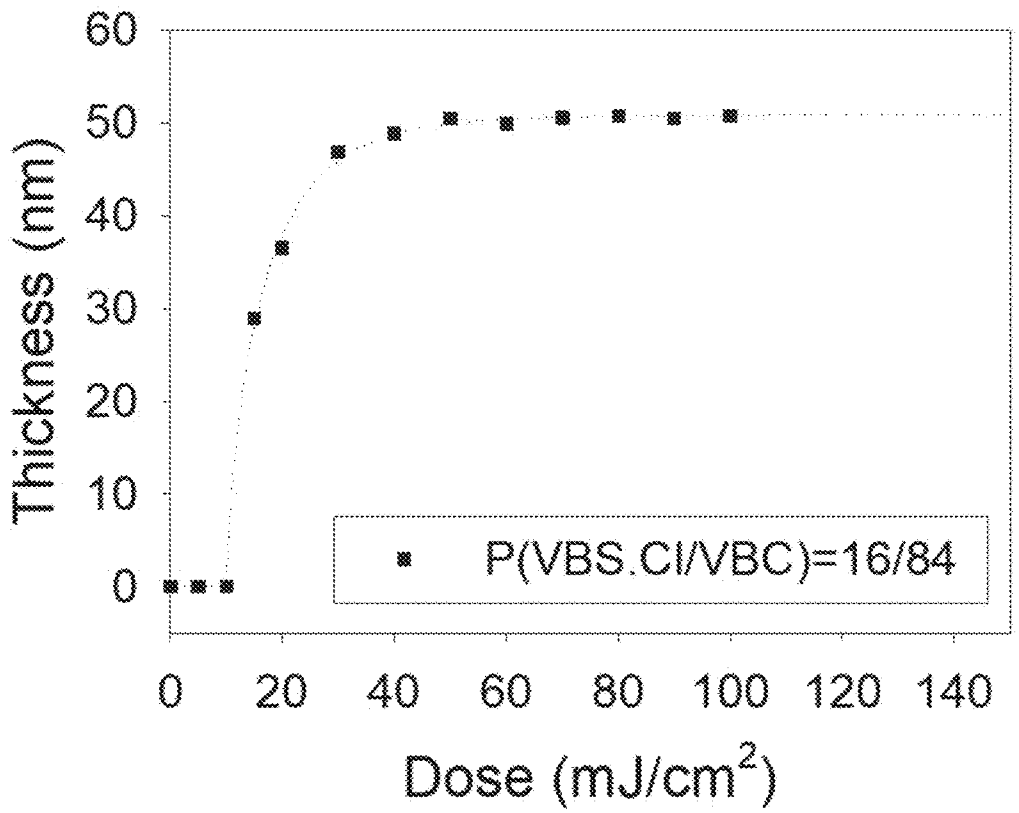
Figure 9E:
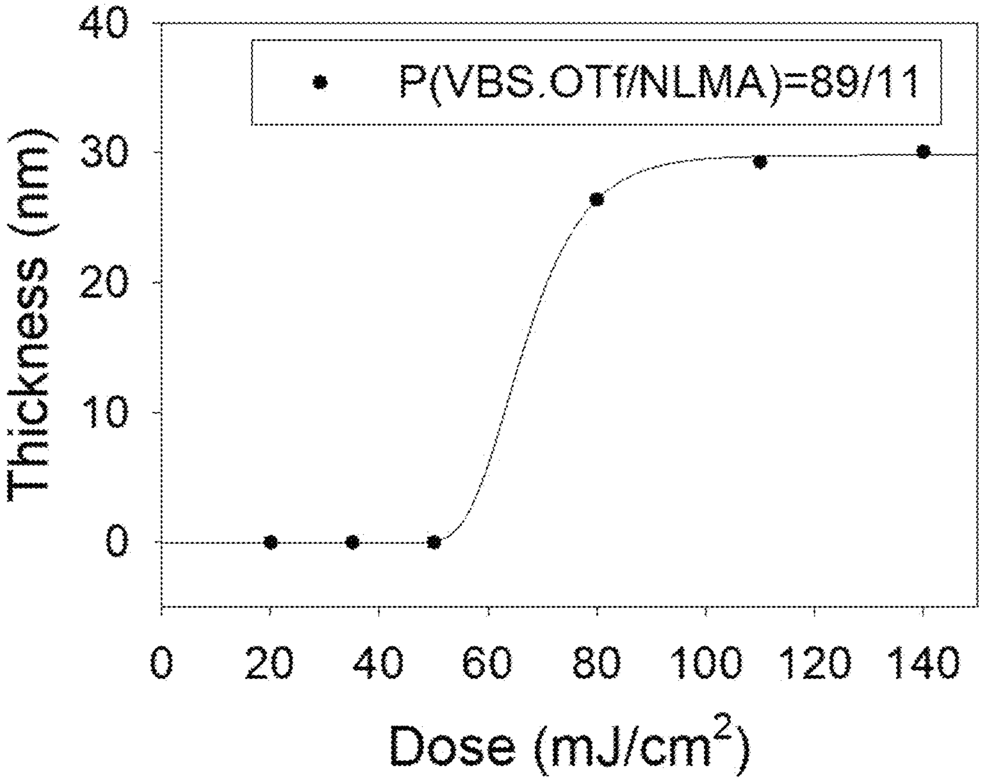
Figure 9F:
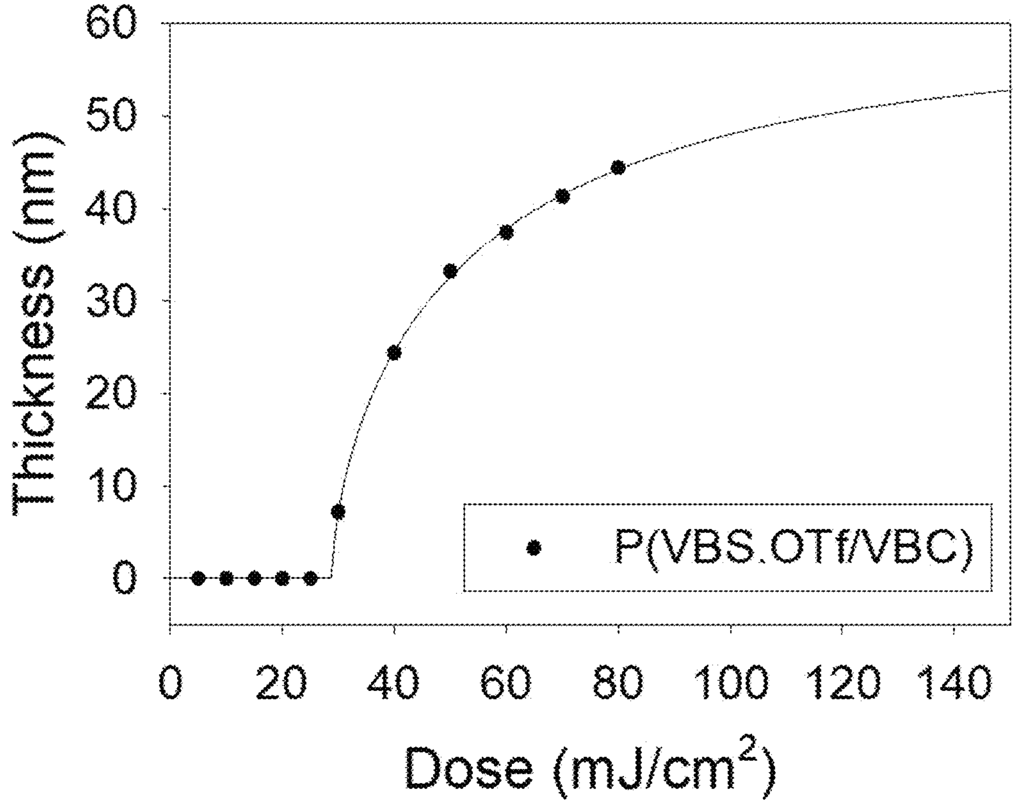

VBS·OTf (0.5 grams (g), 1.4 mmol), VBC (0.861 grams (g), 5.6 mmol), and V601 (0.08 grams (g), 0.4 mmol) were dissolved in 7 mL of THF/ACN (5/5, v/v). The resulting mixture was reacted at 70° C. for 24 hours and then precipitated with diethyl ether, to synthesize P(VBS·OTf/VBC)(=22/78) polymer. The P(VBS·OTf/VBC)(=22/78) polymer thus obtained was analyzed by $^1$H-NMR, and the results thereof are shown in FIG. 8.

Evaluation Example 1

Evaluation of Development

To confirm that the synthesized polymer changes its solubility as a result of crosslinking by exposure, the polymer was exposed to DUV at a particular intensity and developed, and changes in thickness of the polymer before and after the development were examined.

In particular, the polymers synthesized in Synthesis Examples 1 to 6 were dissolved to 2 wt % in casting solvents in Table 1. By spin-coating casting solutions onto silicon wafers followed by drying at 90° C. for 1 minute, films having initial thicknesses in Table 1 were prepared. Then, the films were exposed to a DUV at a wavelength of 248 nm at a dose of 5 mJ/cm$^2$ to 300 mJ/cm$^2$, and the films obtained from the exposure were immersed in developers shown in Table 1 at 25° C. for 60 seconds. Then, the thickness of film remaining thereafter was measured and shown in FIG. 9A to 9F.

TABLE 1

| Polymer | Casting solvent | Developer | Initial thickness (nm) |
|---|---|---|---|
| P(VBS.Cl) | Propylene glycol methylether | □-butyrolactone | 55 |
| P(VBS.OTf) | Ethyl lactate/g-butyrolactone = 8/2 (w/w) | 2.28 wt % TMAH solution (aq.) | 30 |
| P(VBC) | n-butyl acetate | n-butyl acetate | 56 |
| P(VBS.Cl/VBC) | n-butyl acetate | n-butyl acetate | 54 |
| P(VBS.OTf/NLMA) | Ethyl lactate/g-butyrolactone = 8/2 (w/w) | 2.28 wt % TMAH solution (aq.) | 31 |
| P(VBS.OTf/VBC) | n-butyl acetate | □-butyrolactone | 65 |

Referring to FIGS. 9A to 9F, it was found that all of the synthesized polymers underwent crosslinking reactions following DUV exposure, and thus have a changed solubility with respect to the developer. It was also found that all synthesized polymers had a high sensitivity such that their respective solubility in developer changes even at a low dose of 50 mJ/cm$^2$ or less.

Examples of the disclosure may provide a polymer which changes physical properties thereof via a rapid reaction even at a low dose, and a resist composition including the polymer.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A polymer comprising:

a first repeating unit represented by Formula 1 and a second repeating unit represented by Formula 2, and being free of a repeating unit of which a structure changes by an acid:

[Formula 1]

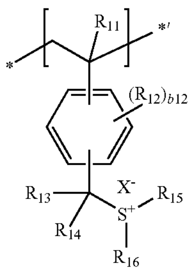

[Formula 2]

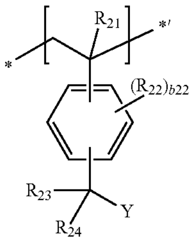

wherein, in Formulae 1 and 2, $R_{11}$ and $R_{21}$ are each independently hydrogen, deuterium, halogen, a $C_1$-$C_6$ linear or branched alkyl group, or a halogenated $C_1$-$C_6$ linear or branched alkyl group;

$R_{12}$ to $R_{14}$ and $R_{22}$ to $R_{24}$ are each independently hydrogen, deuterium, halogen, or a linear, branched, or cyclic monovalent $C_1$-$C_{20}$ hydrocarbon group optionally containing a heteroatom;

b12 and b22 are each independently integers of 1 to 4;

$R_{15}$ and $R_{16}$ are each independently a linear, branched, or cyclic monovalent $C_1$-$C_{20}$ hydrocarbon group optionally containing a heteroatom, and $R_{15}$ and $R_{16}$ optionally bond together to form a ring;

$X^-$ is a counter ion;

Y is at least one of a halogen, $R_{18}SO_3$—*", $R_{18}CO_2$—*", $(R_{18})_2PO_4$—*", or $NO_3$—*";

$R_{18}$ is a linear, branched, or cyclic monovalent $C_1$-$C_{20}$ hydrocarbon group optionally containing a heteroatom;

* and *' are each a bonding site with a neighboring atom; and

*" is a bonding site with $C(R_{23})$ $(R_{24})$.

2. The polymer of claim 1, wherein $R_{12}$ to $R_{14}$ and $R_{22}$ to $R_{24}$ are each independently hydrogen, deuterium, halogen, a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, or a $C_6$-$C_{20}$ aryl group.

3. The polymer of claim 1, wherein $R_{13}$ is one of hydrogen or deuterium; and $R_{14}$ is hydrogen, deuterium, a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, or a $C_6$-$C_{20}$ aryl group, and $R_{23}$ is one of hydrogen or deuterium; and $R_{24}$ is one of hydrogen, deuterium, a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, or a $C_6$-$C_{20}$ aryl group.

4. The polymer of claim 1, wherein $R_{15}$ and $R_{16}$ are each independently a substituted or unsubstituted $C_1$-$C_{20}$ alkyl group or a substituted or unsubstituted $C_3$-$C_{20}$ carbocyclic group, and $R_{15}$ and $R_{16}$ optionally bond together to form a ring.

5. The polymer of claim 1, wherein $R_{15}$ and $R_{16}$ are each independently a $C_1$-$C_{10}$ alkyl group unsubstituted or substituted with at least one of halogen, a hydroxy group, a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, or a $C_6$-$C_{10}$ aryl group; or a $C_6$-$C_{20}$ aryl group unsubstituted or substituted with at least one of halogen, a hydroxy group, a $C_1$-$C_6$ alkyl group, a halogenated $C_1$-$C_6$ alkyl group, a $C_1$-$C_6$ alkoxy group, a $C_3$-$C_6$ cycloalkyl group, and a $C_3$-$C_6$ cycloalkoxy group, and $R_{15}$ and $R_{16}$ optionally bond together to form a ring.

6. The polymer of claim 1, wherein

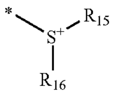

is represented by at least one of Formulae 3-1 to 3-3 below:

3-1

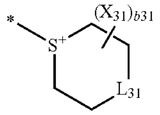

3-2

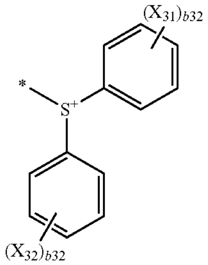

-continued 3-3

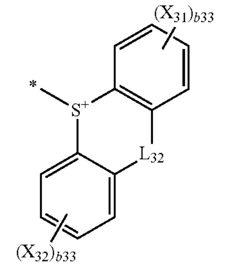

wherein, in Formulae 3-1 to 3-3, $L_{31}$ and $L_{32}$ are each independently a single bond, O, S, CO, SO, $SO_2$, CRR', or NR;

R and R' are each independently hydrogen, deuterium, halogen, a hydroxyl group, a $C_1$-$C_6$ alkyl group, a halogenated $C_1$-$C_6$ alkyl group, a $C_1$-$C_6$ alkoxy group, a $C_3$-$C_6$ cycloalkyl group, or a $C_3$-$C_6$ cycloalkoxy group;

$X_{31}$ and $X_{32}$ are each independently hydrogen, halogen, a $C_1$-$C_6$ alkyl group, or a halogenated $C_1$-$C_6$ alkyl group;

b31 is an integer of 1 to 8, b32 is an integer of 1 to 5, and b33 is an integer of 1 to 4.

7. The polymer of claim 1, wherein $X^-$ is a halogen ion, $R_{17}SO_3^-$, $R_{17}CO_2^-$, $(R_{17})_2PO_4^-$, $PF_6^-$, or $BF_4^-$, and $R_{17}$ is a $C_1$-$C_{10}$ alkyl group unsubstituted or substituted with at least one of halogen, a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, and a $C_6$-$C_{10}$ aryl group; or a $C_6$-$C_{20}$ aryl group unsubstituted or substituted with at least one of halogen, a $C_1$-$C_6$ alkyl group, a halogenated $C_1$-$C_6$ alkyl group, a $C_1$-$C_6$ alkoxy group, a $C_3$-$C_6$ cycloalkyl group, or a $C_3$-$C_6$ cycloalkoxy group.

8. The polymer of claim 1, wherein $R_{18}$ is a $C_1$-$C_{10}$ alkyl group unsubstituted or substituted with at least one of halogen, a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, and a $C_6$-$C_{10}$ aryl group; or a $C_6$-$C_{20}$ aryl group unsubstituted or substituted with at least one of halogen, a $C_1$-$C_6$ alkyl group, a halogenated $C_1$-$C_6$ alkyl group, a $C_1$-$C_6$ alkoxy group, a $C_3$-$C_6$ cycloalkyl group, or a $C_3$-$C_6$ cycloalkoxy group.

9. The polymer of claim 1, wherein the first repeating unit is represented by Formula 1-1; and the second repeating unit is represented by Formula 2-1:

[Formula 1-1]

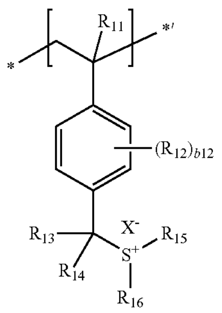

-continued

[Formula 2-1]

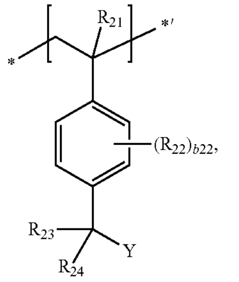

$R_{11}$ to $R_{16}$, b12, and $X^-$ are the same as defined in Formula 1, and $R_{21}$ to $R_{24}$, b22, and Y are the same as defined as defined in Formula 2.

10. The polymer of claim 1, further comprising:

a third repeating unit represented by Formula 4:

[Formula 4]

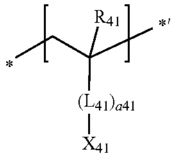

wherein, in Formula 4, $R_{41}$ is hydrogen, deuterium, halogen, a linear or branched $C_1$-$C_6$ alkyl group, or a linear or branched halogenated $C_1$-$C_6$ alkyl group, $L_{41}$ is a single bond, a substituted or unsubstituted $C_1$-$C_{10}$ alkylene group, a substituted or unsubstituted $C_3$-$C_{10}$ cycloalkylene group, a substituted or unsubstituted $C_3$-$C_{10}$ heterocycloalkylene group, a substituted or unsubstituted phenylene group, a substituted or unsubstituted naphthylene group, *—O—*', *—C(═O)O—*', —OC(═O)—*', *—C(═O) NH—*', —NHC(═O)—*', or any combination thereof, a41 is an integer of 1 to 6, and $X_{41}$ is a non-acid labile group.

11. The polymer of claim 10, wherein $X_{41}$ is hydrogen or a linear, branched, or cyclic monovalent $C_1$-$C_{20}$ hydrocarbon group containing at least one polar moiety selected from among a hydroxy group, halogen, a cyano group, a carbonyl group, a carboxyl group, *—O—*', *—C(═O)O—*', —OC(═O)—*', *—S(═O)O—*', —OS(═O)—*', a lactone ring, a sultone ring, and a carboxylic anhydride moiety.

12. The polymer of claim 10, wherein $X_{41}$ is represented by any one of Formulae 5-1 to 5-5:

5-1

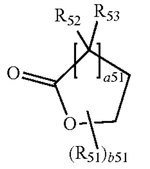

-continued 5-2

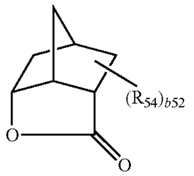

5-3

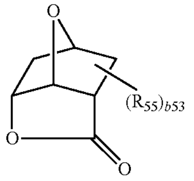

5-4

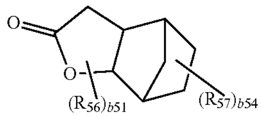

5-5

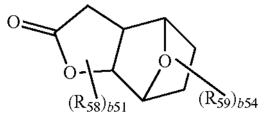

wherein, in Formulae 5-1 to 5-5, a51 is 1 or 2;

$R_{51}$ to $R_{59}$ are each independently a bonding site with a neighboring atom, hydrogen, a hydroxy group, halogen, a cyano group, a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, or a $C_6$-$C_{10}$ aryl group, one of $R_{51}$ to $R_{53}$, one of $R_{54}$, one of $R_{55}$, one of $R_{56}$ and $R_{57}$, and one of $R_{58}$ and $R_{59}$ are each a bonding site with a neighboring atom, b51 is an integer of 1 to 4, b52 is wan integer of 1 to 10, b53 and b54 are each independently integers of 1 to 8, and b55 is an integer of 1 to 6.

13. The polymer of claim 10, wherein the third repeating unit represented by Formula 4 is represented by any one of Formulae 4-1 and 4-2:

4-1

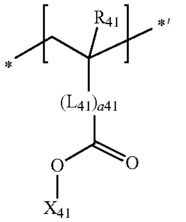

-continued 4-2

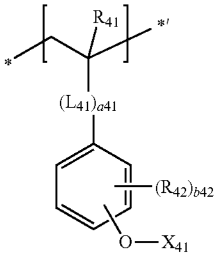

wherein, in Formulae 4-1 and 4-2, $L_{41}$ and $X_{41}$ are each the same as defined in Formula 4, a41 is selected from among integers of 1 to 4, $R_{42}$ is hydrogen or a $C_1$-$C_{10}$ linear, branched or cyclic monovalent hydrocarbon group, and b42 is an integer of 1 to 4.

14. A resist composition comprising:

the polymer of claim 1; and an organic solvent.

15. The resist composition of claim 14, wherein the resist composition is substantially free of a photoacid generator.

16. The resist composition of claim 14, wherein the resist composition is substantially free of a compound having a molecular weight of 1,000 or more, other than the polymer.

17. A method of forming a pattern, the method comprising:

forming a resist film by applying the resist composition of claim 14;

exposing at least a portion of the resist film with a high-energy beam; and developing the exposed resist film using a developer.

18. The method of claim 17, wherein the exposing is carried out by irradiation of deep UV light (DUV), extreme UV light (EUV), and/or an electron beam (EB).

19. The method of claim 17, wherein crosslinks are formed between the polymers by exposing the resist film.

20. The method of claim 17, wherein the exposed resist film comprises an exposed portion and an unexposed portion, and the unexposed portion is removed in the developing.

21. A polymer comprising:

a first repeating unit represented by Formula 1 or a second repeating unit represented by Formula 2, and being free of a repeating unit of which a structure changes by an acid:

[Formula 1]

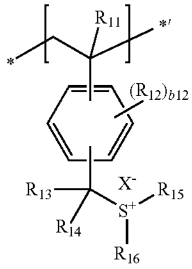

-continued

[Formula 2]

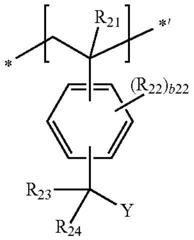

wherein, in Formulae 1 and 2, $R_{11}$ and $R_{21}$ are each independently hydrogen, deuterium, halogen, a $C_1$-$C_6$ linear or branched alkyl group, or a halogenated $C_1$-$C_6$ linear or branched alkyl group;

$R_{12}$ to $R_{14}$ and $R_{22}$ to $R_{24}$ are each independently hydrogen, deuterium, halogen, or a linear, branched, or cyclic monovalent $C_1$-$C_{20}$ hydrocarbon group optionally containing a heteroatom;

b12 and b22 are each independently integers of 1 to 4;

$R_{15}$ and $R_{16}$ are each independently a linear, branched, or cyclic monovalent $C_1$-$C_{20}$ hydrocarbon group optionally containing a heteroatom, and $R_{15}$ and $R_{16}$ optionally bond together to form a ring;

$X^-$ is a halogen ion, $R_{17}SO_3^-$, $R_{17}CO_2^-$, or $(R_{17})_2PO_4^-$, $R_{17}$ is a $C_1$-$C_{10}$ alkyl group unsubstituted or substituted with at least one of halogen, a $C_1$-$C_6$ alkyl group, a halogenated $C_1$-$C_6$ alkyl group, a $C_1$-$C_6$ alkoxy group, a $C_3$-$C_6$ cycloalkyl group, a $C_3$-$C_6$ cycloalkoxy group, and a $C_6$-$C_{10}$ aryl group; or a $C_6$-$C_{20}$ aryl group unsubstituted or substituted with at least one of halogen, a $C_1$-$C_6$ alkyl group, a halogenated $C_1$-$C_6$ alkyl group, a $C_1$-$C_6$ alkoxy group, a $C_3$-$C_6$ cycloalkyl group, or a $C_3$-$C_6$ cycloalkoxy group;

Y is a halogen;

$R_{18}$ is a linear, branched, or cyclic monovalent $C_1$-$C_{20}$ hydrocarbon group optionally containing a heteroatom; and

* and *' are each a bonding site with a neighboring atom.

* * * * *